(12) United States Patent
Matsui et al.

(10) Patent No.: US 7,071,108 B2
(45) Date of Patent: Jul. 4, 2006

(54) CHEMICAL MECHANICAL POLISHING SLURRY CONTAINING ABRASIVE PARTICLES EXHIBITING PHOTOCATALYTIC FUNCTION

(75) Inventors: Yukiteru Matsui, Yokohama (JP);
Gaku Minamihaba, Kawasaki (JP);
Hiroyuki Yano, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 280 days.

(21) Appl. No.: 10/201,488

(22) Filed: Jul. 24, 2002

(65) Prior Publication Data
US 2003/0022502 A1 Jan. 30, 2003

(30) Foreign Application Priority Data
Jul. 30, 2001 (JP) ............................. 2001-229884
Mar. 27, 2002 (JP) ............................. 2002-089951

(51) Int. Cl.
*H01L 21/302* (2006.01)
(52) U.S. Cl. ...................... 438/692; 438/693; 438/696; 438/700
(58) Field of Classification Search ................ 438/692, 438/693, 696, 699, 700
See application file for complete search history.

(56) References Cited

U.S. PATENT DOCUMENTS

| 5,997,620 | A | 12/1999 | Kodama et al. | |
|---|---|---|---|---|
| 6,177,026 | B1 * | 1/2001 | Wang et al. | 252/79.1 |
| 6,183,351 | B1 | 2/2001 | Aoki | |
| 6,328,644 | B1 * | 12/2001 | Kuramochi et al. | 451/526 |
| 6,362,103 | B1 * | 3/2002 | Watts | 438/691 |
| 6,364,744 | B1 * | 4/2002 | Merchant et al. | 451/6 |
| 6,435,947 | B1 * | 8/2002 | Mueller et al. | 451/41 |
| 6,638,143 | B1 * | 10/2003 | Wang et al. | 451/41 |
| 6,672,945 | B1 * | 1/2004 | Matsuo et al. | 451/56 |

FOREIGN PATENT DOCUMENTS

JP 2001009723 A * 1/2001
WO WO 99/61540 12/1999

OTHER PUBLICATIONS

Product Information, TRITON® D-16 Surfactant.*
SURFYNOL®, http://www.chunghan.chem.co.kr/eng_surfynol.htm.*
Hiroyuki Yano, et al., "Aqueous Dispersion, Aqueous Dispersion for Chemical Mechanical Polishing Used for Manufacture of Semiconductor Devices, Method for Manufacture of Semiconductor Devices, and Method for Formation of Embedded Wiring", U.S. Appl. No. 09/531,163, filed Mar. 17, 2000.
Notification of Reasons for Rejection issued by the Japanese Patent Office, mailed Oct. 18, 2005, for Japanese Patent Application No. 2002-089951, and English-language translation thereof.

* cited by examiner

*Primary Examiner*—Nadine G. Norton
*Assistant Examiner*—Binh X. Tran
(74) *Attorney, Agent, or Firm*—Finnegan, Henderson, Farabow, Garrett & Dunner, L.L.P.

(57) ABSTRACT

There is provided a method of manufacturing a semiconductor device, including irradiating a chemical mechanical polishing slurry with light on applying a chemical mechanical polishing treatment using the slurry to a polishing section of a target substrate to be polished, the slurry containing a dispersion medium and abrasive particles dispersed in the dispersion medium and exhibiting a photocatalytic function upon irradiation with light.

22 Claims, 17 Drawing Sheets

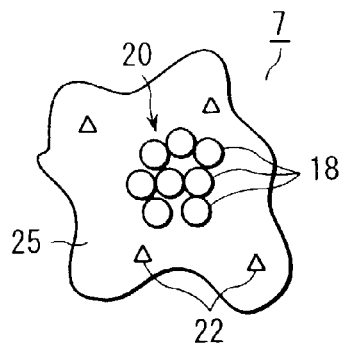
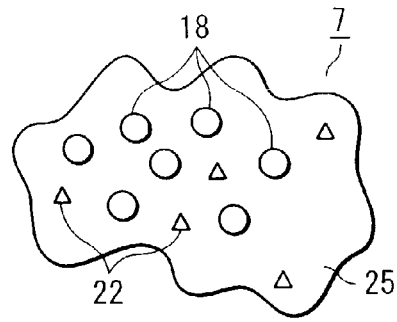
FIG. 1A PRIOR ART  FIG. 1B PRIOR ART
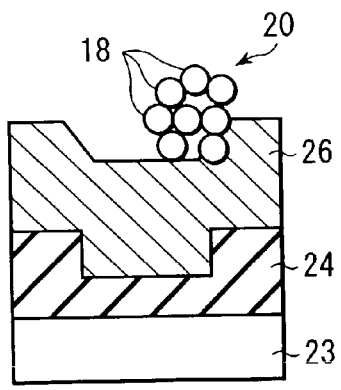
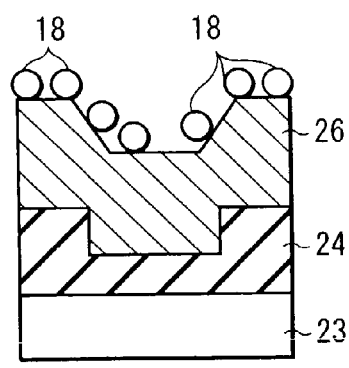
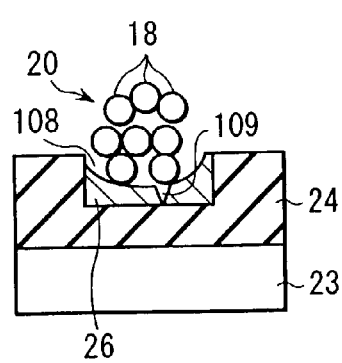
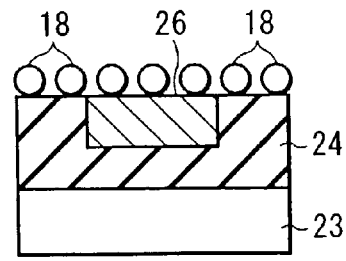
FIG. 2A PRIOR ART  FIG. 2B PRIOR ART

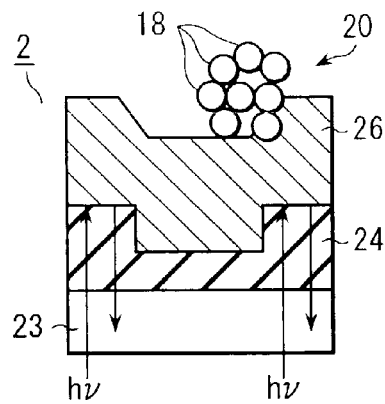 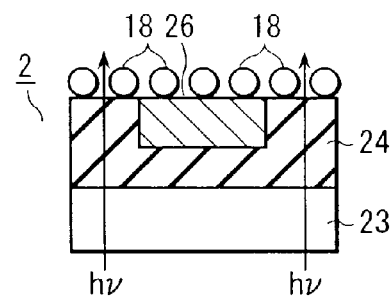
FIG. 11A  FIG. 11B
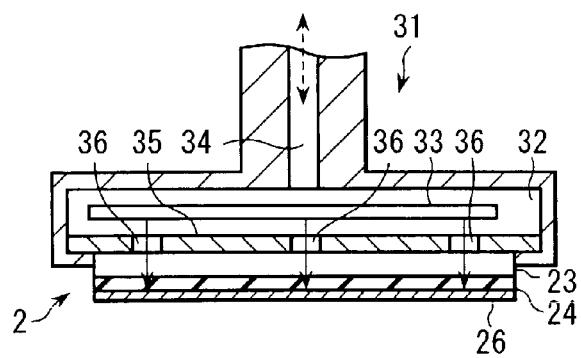
FIG. 12
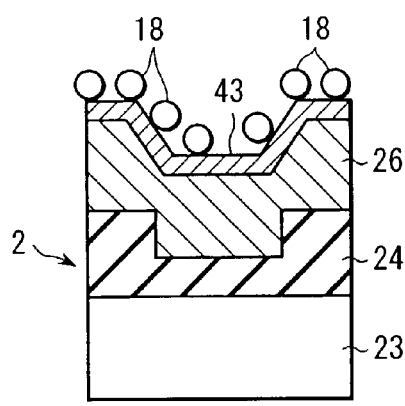 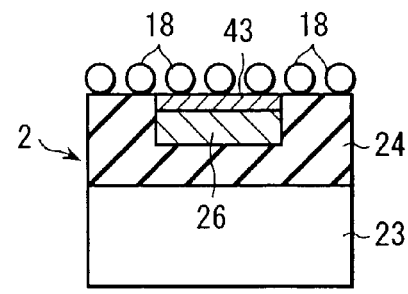
FIG. 13A  FIG. 13B

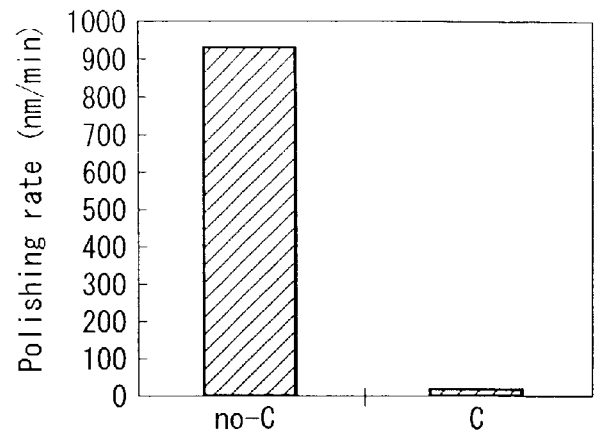
FIG. 23
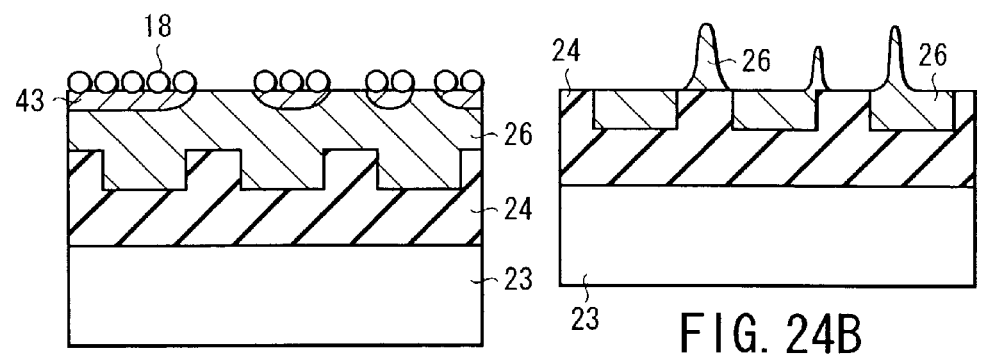
FIG. 24A
FIG. 24B
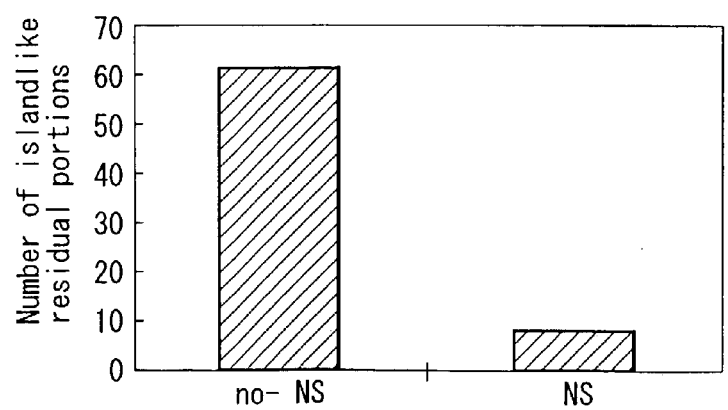
FIG. 25

CHEMICAL MECHANICAL POLISHING SLURRY CONTAINING ABRASIVE PARTICLES EXHIBITING PHOTOCATALYTIC FUNCTION

CROSS-REFERENCE TO RELATED APPLICATIONS

This application is based upon and claims the benefit of priority from the prior Japanese Patent Applications No. 2001-229884, filed Jul. 30, 2001; and No. 2002-089951, filed Mar. 27, 2002, the entire contents of both of which are incorporated herein by reference.

BACKGROUND OF THE INVENTION

1. Field of the Invention

The present invention relates to a slurry used in a chemical mechanical polishing method, a method of manufacturing a semiconductor device and an apparatus of manufacturing a semiconductor device, particularly, to a slurry for a chemical mechanical polishing method that can be utilized for forming a buried wiring of a DRAM, a high speed logic LSI, etc., a method of manufacturing a semiconductor device using the particular slurry, and an apparatus of manufacturing a semiconductor device capable of utilizing the particular slurry.

2. Description of the Related Art

In recent years, miniaturization and improvement in the density of the device are being promoted in the field of semiconductor devices, and various fine processing technologies are being researched and developed. Particularly, a chemical mechanical polishing (CMP) technology is indispensable for forming a fine and high density buried wiring (damascene wiring).

The CMP technology includes a metal CMP technology that can be utilized for forming a buried wiring of a metal such as copper or aluminum. In the metal CMP technology, the polishing rate, the flatness and the scratch constitute important parameters in evaluating the CMP performance as described in the following. To be more specific, in order to improve the productivity of the semiconductor device, it is necessary to improve the polish processing rate (or throughput) of the metal CMP. Also, in order to suppress the elevation in the resistance value of the buried wiring, it is necessary to diminish as much as possible the excessive polishing amount (metal loss) of the buried wiring called dishing or thinning (or erosion). Further, in order to obtain with a high yield a semiconductor device in which a sufficient current flows through the buried wiring so as to allow the semiconductor device to operate as designed, it is necessary to decrease as much as possible to the density of the scratches generated in the buried wiring.

These properties are greatly dependent on the characteristics of the slurry and the polishing pad used in the CMP. For example, the CMP performance is related to, for example, the hardness of the polishing pad. In the main polish for polishing the metal used for forming a buried wiring, a hard pad having a high flatness is used in general as a pad.

On the other hand, the effect of the slurry for the CMP on the CMP performance are derived from, for example, the abrasive particles, the oxidizing agent or an additive contained in the slurry. Particularly, the characteristics of the abrasive particles give highly serious influences to the CMP performance. For example, the polishing rate is increased in general with increase in the size of the abrasive particles in the slurry.

The relationship between the characteristics of the slurry for the CMP and the CMP performance will now be described with reference to FIGS. 1A, 1B, 2A and 2B.

In general, a CMP slurry 7 contains a solvent 25 such as water, abrasive particles 18 such as alumina ($Al_2O_3$) particles or silica ($SiO_2$) particles, and an oxidizing agent 22. As shown in FIG. 1A, the abrasive particles 18 are generally agglomerated within the solvent 25 of the slurry 7 so as to form an agglomerate (or secondary particle) 20. The polishing rate is increased with increase in the diameter of the agglomerate, i.e., the diameter of the secondary particle.

However, if the diameter of the secondary particle is increased, a deep dishing 108 tends to be generated in a metal wiring 26, as shown in FIG. 2A. Also, where the abrasive particles 19 are vigorously agglomerated and the secondary particle 20 is rendered excessively large, the abrasive particles 18 form a coarse particle. If a coarse particle is formed, a scratch 109 tends to be generated in applying the CMP to the metal formed of a relatively soft material such as aluminum.

On the contrary, where the abrasive particles 18 are sufficiently dispersed as shown in FIG. 1B, it is possible to suppress the generation of the dishing 108 in the metal wiring 26, as shown in FIG. 2B. In addition, the scratch 109 is unlikely to be generated. However, where the degree of dispersion of the abrasive particles 18 is increased, the polishing rate is markedly lowered. In other words, to suppress the generation of the dishing 108 and the scratch 109 has a trade-off relationship with the increase in the polishing rate.

It is considered reasonable to understand that the trade-off relationship noted above is generated as follows. In general, the polishing surface of the polishing pad used in performing the main polish referred to above has a roughness (or coarseness) of about 20 µm. The size of the abrasive grain is sufficiently small, compared with the roughness of the polishing surface of the polishing pad. Therefore, where the agglomerate 20 has a high degree of dispersion so as to provide an excessively large distance between the adjacent abrasive particles, the abrasive particles 18 is buried in the recessed portion on the surface of the polishing pad, with the result that each abrasive particles 18 fails to sufficiently interact with the metal wiring 26. It follows that, if the degree of dispersion of the agglomerate 20 is excessively high, the polishing power of the slurry 7 is lowered, which markedly lowers the polishing rate.

As described above, the degree of dispersion of the abrasive particles 18 seriously influences the CMP performance and, thus, it is important to control the degree of dispersion of the abrasive particles 18 to a desired value. However, the agglomerated state of the abrasive particles 18 tends to be changed with time. For example, if the CMP slurry 7 is stored without being used, the number of coarse particles is increased with time. To be more specific, where the slurry 7 is left to stand for a long time, the dishing 108 and the scratch 109 tend to be generated more easily. If the number of coarse particles is increased, the coarse particles are agglomerated so as to form a gigantic coarse particle. The agglomerated coarse particles are rendered incapable of floating in the solvent 25 so as to be precipitated. It is substantially impossible to disperse again the precipitated coarse particles in the solvent. In other words, the particular slurry is rendered substantially incapable of being used.

The oxidizing agent 22 contained in the CMP slurry 7 also tends to be decomposed. If decomposed, the oxidizing power of the oxidizing agent is markedly lowered. The oxidizing agent 22 whose oxidizing power has been lowered constitutes one of the main factors for bringing about the deterioration of the CMP performance such as the decrease in the polishing rate. In other words, the deterioration with time of the oxidizing agent 22 also causes the shortening in the life of the slurry 7.

BRIEF SUMMARY OF THE INVENTION

According to a first aspect of the present invention, there is provided a chemical mechanical polishing slurry comprising a dispersion medium, abrasive particles dispersed in the dispersion medium and exhibiting a photocatalytic function upon irradiation with light, and a nonionic surfactant dissolved in the dispersion medium.

According to a second aspect of the present invention, there is provided a chemical mechanical polishing slurry comprising a dispersion medium, abrasive particles dispersed in the dispersion medium and exhibiting a photocatalytic function upon irradiation with light, and resin particles dispersed in the dispersion medium.

According to a third aspect of the present invention, there is provided a chemical mechanical polishing slurry comprising a dispersion medium, abrasive particles dispersed in the dispersion medium and exhibiting a photocatalytic function upon irradiation with light, and alumina particles dispersed in the dispersion medium.

According to a fourth aspect of the present invention, there is provided a chemical mechanical polishing slurry comprising a dispersion medium, and abrasive particles dispersed in the dispersion medium and exhibiting a photocatalytic function upon irradiation with light, the abrasive particles containing titanium, oxygen, and at least one element selected from the group consisting of nickel, copper, silver, gold and niobium.

According to a fifth aspect of the present invention, there is provided a chemical mechanical polishing slurry comprising a dispersion medium, and abrasive particles dispersed in the dispersion medium and exhibiting a photocatalytic function upon irradiation with light, the abrasive particles containing titanium, oxygen and at least one element selected from the group consisting of nitrogen and sulfur.

According to a sixth aspect of the present invention, there is provided a method of manufacturing a semiconductor device, comprising irradiating a chemical mechanical polishing slurry with light on applying a chemical mechanical polishing treatment using the slurry to a polishing section of a target substrate to be polished, the slurry comprising a dispersion medium and abrasive particles dispersed in the dispersion medium and exhibiting a photocatalytic function upon irradiation with light.

According to a seventh aspect of the present invention, there is provided a method of manufacturing a semiconductor device comprising applying a chemical mechanical polishing treatment to a polishing section of a target substrate to be polished by relatively moving a polishing member and the target substrate, the chemical mechanical polishing treatment comprising supplying a chemical mechanical polishing slurry comprising a dispersion medium and abrasive particles dispersed in the dispersion medium and exhibiting a photocatalytic function upon irradiation with light into a region between the polishing member and the target substrate, and irradiating the slurry interposed between the polishing member and the target substrate with light.

According to an eighth aspect of the present invention, there is provided a method of manufacturing a semiconductor device, comprising forming an insulating film provided with a recessed portion above a semiconductor substrate, forming a barrier layer containing tungsten nitride on the insulating film so as to cover a bottom surface and a side wall of the recessed portion, forming a metal layer containing copper on the barrier layer so as to fill the recessed portion with the metal layer, and applying a chemical mechanical polishing treatment to the metal layer, the chemical mechanical polishing treatment comprising supplying a chemical mechanical polishing slurry comprising a dispersion medium and abrasive particles dispersed in the dispersion medium and exhibiting a photocatalytic function upon irradiation with light onto a polishing member, irradiating the slurry supplied onto the polishing member with light, and relatively moving the polishing member and the semiconductor substrate with the slurry irradiated with light interposed between the polishing member and the metal layer.

According to a ninth aspect of the present invention, there is provided a method of manufacturing a semiconductor device, comprising applying a chemical mechanical polishing treatment to a polishing section of a target substrate to be polished by using a chemical mechanical polishing slurry comprising a dispersion medium and abrasive particles dispersed in the dispersion medium and exhibiting a photocatalytic function upon irradiation with light, and irradiating the slurry that has been used for the chemical mechanical polishing treatment with light.

According to a tenth aspect of the present invention, there is provided a method of manufacturing a semiconductor device, comprising applying a chemical mechanical polishing treatment to a polishing section of a target substrate to be polished by using a chemical mechanical polishing slurry comprising a dispersion medium and abrasive particles dispersed in the dispersion medium and exhibiting a photocatalytic function upon irradiation with light, and removing a polishing refuse produced by the chemical mechanical polishing treatment from the slurry that has been used for the chemical mechanical polishing treatment so as to form a regenerated slurry that can be utilized for the chemical mechanical polishing treatment.

According to an eleventh aspect of the present invention, there is provided a method of manufacturing a semiconductor device, comprising applying a chemical mechanical polishing treatment to a polishing section of a target substrate to be polished by using a chemical mechanical polishing slurry comprising a dispersion medium and abrasive particles dispersed in the dispersion medium and exhibiting a photocatalytic function upon irradiation with light, dissolving a polishing refuse generated by the chemical mechanical polishing treatment and contained in the slurry that has been used for the chemical mechanical polishing treatment, recovering the abrasive particles from the slurry after dissolving the polishing refuse, and forming a regenerated slurry that can be utilized for the chemical mechanical polishing treatment by using the recovered abrasive particles.

According to a twelfth aspect of the present invention, there is provided an apparatus of manufacturing a semiconductor device, comprising a substrate holding tool configured to hold a target substrate to be polished, a polishing tool configured to hold a polishing member, a driving mechanism configured to move the substrate holding tool relative to the polishing tool while allowing the target substrate held by the substrate holding tool to face the polishing member held by the polishing tool, a slurry supply device configured to supply a chemical mechanical polishing slurry to a surface of the polishing member held by the polishing tool that faces the target substrate held by the substrate holding tool, and a light irradiating device configured to irradiate the slurry supplied to the surface of the polishing member that faces the target substrate with light.

BRIEF DESCRIPTION OF THE SEVERAL VIEWS OF THE DRAWING

FIGS. 1A and 1B schematically show the conventional CMP slurry;

FIGS. 2A and 2B are cross sectional views schematically exemplifying the CMP treatment using the conventional CMP slurry;

FIGS. 11A and 11B are cross sectional views exemplifying the CMP treatment according to a second embodiment of the present invention;

FIG. 12 is a cross sectional view schematically showing the head of a CMP apparatus that can be utilized in the second embodiment of the present invention;

FIGS. 13A and 13B are cross sectional views exemplifying the CMP treatment according to a third embodiment of the present invention;

FIG. 23 is a graph showing the relationship between the kind of the polishing pad and the polishing rate;

FIGS. 24A and 24B are cross sectional views schematically showing the residual metal which can be generated in the case of performing the CMP treatment by a method according to a third embodiment of the present invention;

FIG. 25 is a graph exemplifying the effect of adding a nonionic surfactant to the slurry on suppressing the generation of an island-shaped metal residue;

DETAILED DESCRIPTION OF THE INVENTION

Figure 3A:
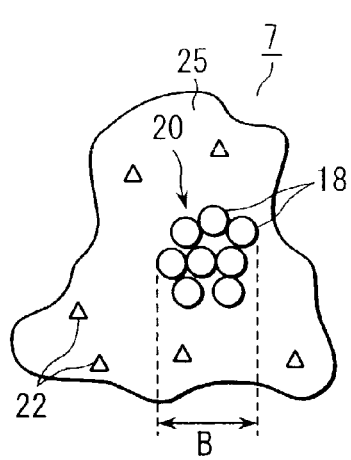
FIGS. 3A and 3B schematically show the CMP slurry according to a first embodiment of the present invention.

The embodiments of the present invention will now be described with reference to the accompanying drawings. Incidentally, the same reference numerals are used for the constituting elements producing the same or similar functions throughout the drawings so as to avoid an overlapping description.

FIRST EMBODIMENT

Figure 3B:
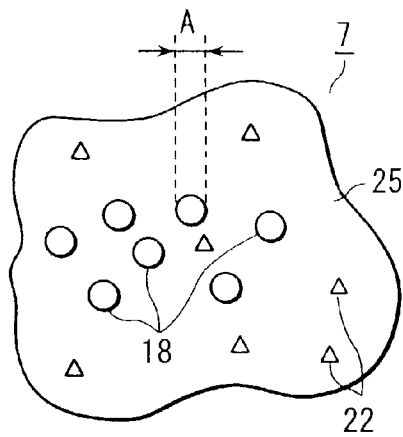

FIGS. 3A and 3B schematically show the slurry 7 for CMP according to the first embodiment of the present invention. The CMP slurry 7 shown in FIGS. 3A and 3B contains a dispersion medium 25, abrasive particles 18 dispersed in the dispersion medium 25, and additives 22 dissolved or dispersed in the dispersion medium 25. In the first embodiment, the additives 22 are optional components.

The dispersion medium 25 is formed of, for example, a polar solvent such as water. Also, the abrasive particles 18 exhibit a photocatalytic function upon irradiation with light having a prescribed wavelength. Incidentally, the term "photocatalytic function" implies that the oxidizing power and/or reducing power of the abrasive particles 18 are changed by the irradiation with light, and that the hydrophilic properties of the abrasive particles are changed by the irradiation with light. For example, where the hydrophilic properties of the abrasive particles 18 are improved by the irradiation with light, the degree of dispersion of the abrasive particles 18 within the dispersion medium such as a polar solvent is improved as shown in FIG. 3B, if the slurry 7 in which the abrasive particles 18 are agglomerated to form a secondary particles 20 as shown in FIG. 3A are irradiated with light.

Figure 4A:
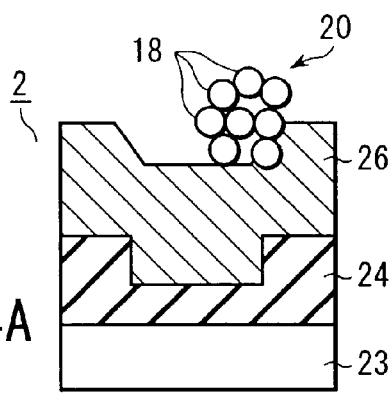
FIGS. 4A and 4B are cross sectional views schematically exemplifying the CMP treatment using the slurry shown in FIGS. 3A and 3B.
Figure 4B:
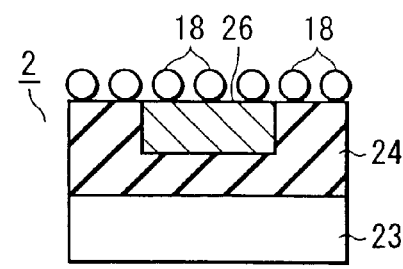

FIGS. 4A and 4B are cross sectional views schematically exemplifying the CMP treatment using the slurry 7 shown in FIGS. 3A and 3B. In this case, a buried metal wiring is to be formed. Also, the polishing pad, the dispersion medium 25 and the additives 22 are omitted in FIGS. 4A and 4B.

A buried metal wiring can be formed, for example, as follows. First, an interlayer insulating film 24 such as a silicon oxide film is formed on a semiconductor substrate (or semiconductor wafer) 23 such as a silicon substrate, followed by forming a groove in the interlayer insulating film. Next, a conductive film (metal film) 26 containing a metal such as copper as a main component is formed on the interlayer insulating film in a manner to bury the groove formed in the interlayer insulating film 24, thereby obtaining a target substrate 2 to be polished, which comprises the metal film 26 acting as a polishing section. Then, a CMP treatment is applied to the metal film 26 by using the slurry 7 shown in FIGS. 3A and 3B. The CMP treatment is carried out in a manner to permit that portion alone of the metal film 26 which is positioned within the groove formed in the interlayer insulating film 24 to remain unremoved and to remove the other portion of the metal film 26. As a result, obtained is a buried metal wiring 26 as shown in FIG. 4B. Incidentally, it is possible to form a buried plug and to form simultaneously a buried wiring and a buried plug by the similar method.

The CMP treatment described above utilizes both the chemical reaction carried out between the components of the slurry 7 and the surface of the metal layer 26 and the physical removal of the reaction product from the surface of the metal layer 26, which is carried out by the abrasive particles 18 contained in the slurry 7. It follows that it is possible to control the reactivity such as the polishing force of the abrasive particles 18 and/or the oxidizing force of the slurry 7 by irradiating appropriately the slurry 7 with light during the polishing treatment, thereby realizing a desired CMP performance.

Where, for example, the degree of dispersion of the abrasive particles 18 contained in the slurry 7 used in the CMP treatment noted above is changed by the irradiation with light, it is possible to control in applying the CMP treatment the particle diameter of the secondary particle 20 formed of the abrasive particles 18 in accordance with the intensity of the light irradiating the slurry 7 positioned on the metal film 26. In other words, in applying the CMP treatment, it is possible to realize a desired polishing accuracy and a desired polishing rate in accordance with the intensity of the light irradiating the slurry 7 positioned on the metal film 26. It should also be noted that, where the oxidizing force of the abrasive particles 18 contained in the slurry 7 used for the CMP treatment is changed by the light irradiation, it is possible to utilize the abrasive particles 18 as an oxidizing agent that permits controlling the oxidizing force in accordance with the intensity of the irradiating light. It follows that, in applying the CMP treatment, it is possible to realize a desired polishing accuracy and a desired polishing rate in accordance with the intensity of the light irradiating the slurry 7 positioned on the metal film 26 in this case, too.

In the first embodiment of the present invention, the metal layer 26 acting as a polishing section contains a metal as a main component as described previously. The metal contained as a main component in the metal layer 26 includes, for example, an elemental metal such as aluminum, copper, tungsten, titanium, molybdenum, niobium, tantalum and vanadium; an alloy containing at least one kind of the elemental metal noted above as a main component; a nitride containing at least one kind of the elemental metal noted above as a main component; a boride containing at least one kind of the elemental metal noted above as a main component; an oxide containing at least one kind of the elemental metal noted above as a main component; a metal compound containing at least one kind of the elemental metal noted above as a main component and at least two elements selected from the group consisting of nitrogen, boron and oxygen. The metal layer 26 may be of a single layer structure or of a laminate structure.

Where the degree of dispersion of the abrasive particles 18 contained in the slurry 7 is changed by the irradiation with light in the first embodiment of the present invention, the degree of dispersion of the abrasive particles 18 may be increase by the irradiation with light. Also, where the oxidizing force of the abrasive particles 18 contained in the slurry 7 is changed by the irradiation with light, the oxidizing force of the abrasive particles 18 may be increased by the irradiation with light. Further, where both the degree of dispersion and the oxidizing force of the abrasive particles 18 contained in the slurry 7 are changed by the irradiation with light, both the degree of dispersion and the oxidizing force of the abrasive particles 18 may be increased by the irradiation with light.

The abrasive particles 18 exhibiting the photocatalytic function described above include, for example, particles containing any of titanium oxide, tin oxide, niobium oxide, cadmium selenide and cadmium sulfide.

It is possible for the slurry 7 to contain an oxidizing agent as the additive 22. The oxidizing agent includes, for example, a material having a standard electrode potential between −3.0V and +3.0V such as hydrogen peroxide, ammonium peroxodisulfate, phosphoric acid, nitric acid and ammonium serium nitrate. Also, where the slurry 7 contains the oxidizing agent, the content of the oxidizing agent should generally fall within a range of 0.1% by weight to 5.0% by weight.

Where the abrasive particles 18 are allowed to exhibit an oxidizing force by the irradiation with light, it is possible for the slurry 7 not to contain an oxidizing agent as the additive 22. It should be noted, however, that, in order to utilize more effectively the oxidizing force of the abrasive particles 18, it is desirable to adjust appropriately the pH value of the slurry 7 by using a pH adjuster such as an inorganic acid which includes nitric acid, phosphoric acid, hydrochloric acid, sulfuric acid, etc.

It is desirable for the primary particle diameter A of the abrasive particles 18 to be distributed to fall within a range of 5 nm to 1,000 nm, more desirably within a range of 5 nm to 20 nm. On the other hand, it is desirable for the secondary particle diameter B of the abrasive particles 18 to be distributed to fall within a range of 100 nm to 1,000 nm. This will now be described with reference to FIG. 5.

Figure 5:
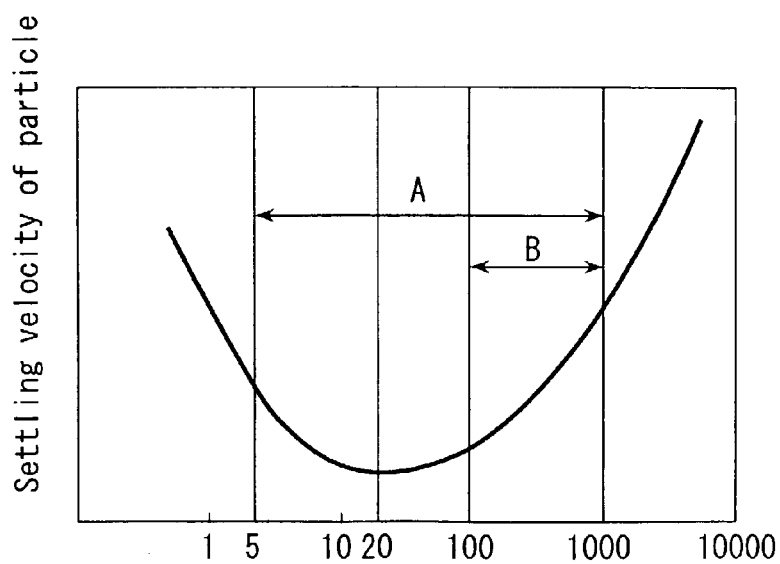
FIG. 5 is a graph showing the relationship between the particle diameter of the abrasive particles and the setting velocity of the abrasive particles.

FIG. 5 is a graph showing the relationship between the particle diameter of the abrasive particles and the setting velocity of the abrasive particles. In the graph of FIG. 5, the primary particle diameter A of the abrasive particles 18 and the secondary particle diameter B of the abrasive particles 18 are plotted on the abscissa. On the other hand, the setting velocity of the abrasive particles 18 as primary particles and the setting velocity of the secondary particle 20 formed by agglomeration of the abrasive particles 18 are plotted on the ordinate.

As shown in FIG. 5, the setting velocity of the abrasive particles is markedly increased, if the particle diameters of the abrasive particles 18 made of, for example, titanium oxide and the secondary particle 20 exceed about 1,000 nm. Where the setting velocity of the abrasive particles 18 or the secondary particle 20 is high, it is difficult to maintain the dispersed state of the abrasive particles 18. In other words, the abrasive particles 18 or the secondary particles 20 are precipitated so as to form a precipitate. Since the abrasive particles 18 constituting the precipitate strongly interact with each other, it is substantially impossible to disperse again the abrasive particles 18 in the dispersion medium 25. It is possible to suppress the formation of such a precipitate by setting the particle diameter of the abrasive particles 18 and the secondary particle 20 not to exceed 1,000 nm.

The graph of FIG. 5 also shows that the setting velocity is markedly increased, if the primary particle diameter A of the abrasive particles 18 is smaller than about 5 nm. It should be noted in this connection that, if the primary particle diameter A of the abrasive particles 18 is smaller than about 5 nm, the abrasive particles 18 are allowed to perform the Brownian movement vigorously. If the abrasive particles 18 perform the Brownian movement vigorously, the probability of collision of these abrasive particles 18 is increased so as to increase the probability of mutual coupling of the abrasive particles. It follows that, if the primary particle diameter A of the abrasive particles 18 is smaller than about 5 nm, the setting velocity of the abrasive particles 18 is markedly increased so as to promote the precipitate formation.

In many cases, some of the abrasive particles 18 are present in the slurry 7 in the form of the primary particles, and the remaining abrasive particles 18 are agglomerated within the slurry 7 so as to form the secondary particles 20. In such a case, in order to allow both the primary particles and the secondary particles of the abrasive particles 18 to fall within the range referred to previously, it is desirable for the diameter of the primary particles of the abrasive particles 18 to be distributed to fall within a range of 5 nm to 100 nm, more desirably within a range of 5 nm to 20 nm. Where the primary particle diameter of the abrasive particles 18 falls within the range noted above, it is possible to allow the secondary particle diameters of the abrasive particles 18 to be distributed to fall within a range of 100 nm to 1,000 nm.

The distribution of the primary particle diameters of the abrasive particles noted above can be examined by, for example, observing a TEM image of the abrasive particles 18. Similarly, the distribution of the secondary particle diameters of the abrasive particles 18 can be examined by, for example, observing a TEM image of the abrasive particles 18 or by the particle diameter measuring method utilizing Stokes' law, etc.

As described above, utilized in the first embodiment of the present invention is the photocatalytic function of the abrasive particles 18 that the oxidizing power and/or the reducing power of the abrasive particles 18 are changed by the irradiation with light and/or that the hydrophilic properties of the abrasive particles 18 are changed by the irradiation with light. It is considered reasonable to understand that the particular photocatalytic function is based on the principle given below, though it is not necessarily desirable to describe the invention based on the theoretical background. The principle will now be described, covering the case where the abrasive particles 18 are formed of titanium oxide particles, and a pure water is used as the dispersion medium 25.

It is considered reasonable to understand that the change in the hydrophilic properties of the abrasive particles 18 caused by the irradiation with light is brought about by the principle given below. Specifically, if the titanium oxide particles 18 are irradiated with an ultraviolet light, positive holes are generated in the positions of the titanium atoms contained in the titanium oxide particles 18. The positive holes generated in the positions of the titanium atoms deprive the oxygen atoms contained in the titanium oxide particles 18 of electrons, with the result that the oxygen atoms are oxidized. While the titanium oxide particles 18 are being irradiated with the ultraviolet light, at least some of the oxygen atoms positioned on the surface are in the state of being deprived of electrons, and the water molecules constituting the dispersion medium 24 are adsorbed in those portions of the oxygen atoms which are deprived of the electrons. The surface of the titanium oxide particles 18 having the water molecule adsorbed thereon performs the function of a hydrophilic domain. It is considered reasonable to understand that the hydrophilic properties of the titanium oxide particles 18 are improved by the irradiation with an ultraviolet light by the particular principle.

On the other hand, it is considered reasonable to understand that the change in the oxidizing power of the abrasive particles 18 is brought about by the principle given below. Specifically, some part of the is positive holes generated on the surfaces of the titanium oxide particles 18 by the irradiation with an ultraviolet light deprives the metal atoms constituting the metal layer 26 of electrons in the case where the titanium oxide particles 18 are in contact with the metal layer or are positioned very close to the metal layer 26. Also, the other part of the positive holes generated on the surfaces of the titanium oxide particles 18 by the irradiation with an ultraviolet light deprives the hydroxyl ions contained in the water constituting the dispersion medium 25 of electrons so as to generate hydroxy radicals. The hydroxy radicals thus generated deprive the metal atoms constituting the metal layer 26 of electrons. Incidentally, the metal atom such as a copper atom deprived of electrons promptly forms an oxide such as $CuO_x$. Since the oxidizing power of the abrasive particles 18 is brought about by the positive hole generated by the irradiation with an ultraviolet light, it is possible to change the oxidizing power of the abrasive particles 18 by changing the intensity of the ultraviolet light irradiating the titanium oxide particles 18.

It is possible to variously carry out the CMP treatment by utilizing the particular photocatalytic function of the abrasive particles 18. For example, it is possible to set constant the intensity of the light irradiating the slurry 7 during the CMP treatment. Alternatively, it is also possible to change the intensity of the light irradiating the slurry 7 during the CMP treatment. For example, in the latter case, it is possible to irradiate the slurry 7 with light immediately before the CMP treatment is finished without irradiating the slurry 7 with the light in the initial period of the CMP treatment, or to increase the intensity of the light irradiating the slurry 7 immediately before the CMP treatment is finished while irradiating the slurry 7 with light having a low intensity in the initial period of the CMP treatment. In this case, it is possible to carry out the polishing with a high polishing rate in the initial period of the CMP treatment and to perform a high precision polishing immediately before the CMP treatment is finished. It follows that it is possible to increase the polishing rate and to effectively suppress the occurrence of the dishing, the erosion and the scratches.

Where particles contains titanium oxide are used as the abrasive particles 18, it is possible to use the titanium oxide crystal having any of the anatase type crystal structure, the rutile type crystal structure and the brookite type crystal structure, though it is desirable to use the titanium oxide crystal having the anatase type crystal structure. This will now be described with reference to FIGS. 6A, 6B, 6C and 7.

Figure 6A:
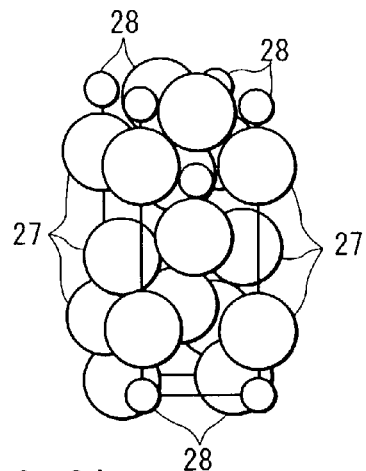
FIGS. 6A, 6B and 6C show the crystal structures of the anatase type titanium oxide, the rutile type titanium oxide and the brookite type titanium oxide, respectively.
Figure 6B:
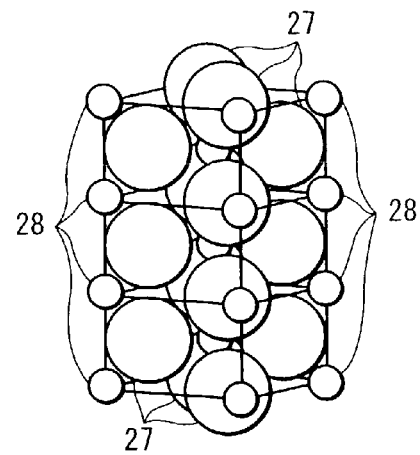
Figure 6C:
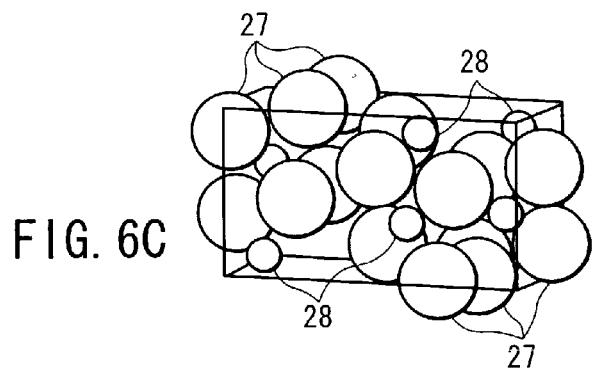
Figure 7:
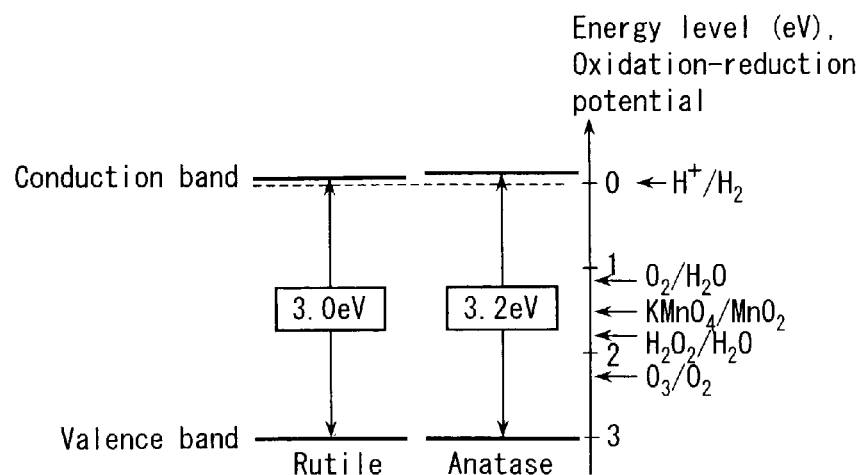
FIG. 7 shows the energy band of titanium oxide.

FIGS. 6A, 6B and 6C show the crystal structures of the anatase type, rutile type and brookite type titanium oxide crystals. On the other hand, FIG. 7 shows the energy band of titanium oxide. Incidentally, reference numerals 27 shown in FIGS. 6A to 6C denote titanium atoms, with reference numerals 28 denoting oxygen atoms.

The natural titanium oxide is known to have the anatase type, rutile type and brookite type crystal structures shown in FIGS. 6A to 6C. Among the titanium oxides having these crystal structures, the anatase type titanium oxide shown in FIG. 6A and the rutile type titanium oxide shown in FIG. 6B are mainly used in the industry. Presently, vigorous research is being made in an attempt to put the brookite type titanium oxide shown in FIG. 6C to practical use.

The anatase type, rutile type and brookite type titanium oxides differ from each other in the photocatalytic function. For example, the anatase type titanium oxide exhibits a photocatalytic activity higher than that exhibited by the rutile type titanium oxide. The difference in the photocatalytic activity is derived from the difference in the energy band between the anatase type titanium oxide and the rutile type titanium oxide, which is shown in FIG. 7.

Titanium oxide 18 generates electrons in the conduction band and positive holes in the valence band by absorbing the light having an energy higher than the band gap, which is a difference in energy between the valance band and the conduction band. As shown in FIG. 7, the band gap of the anatase type titanium oxide is about 3.2 eV, and the band gap of the rutile type titanium oxide is about 3.0 eV. As apparent from the values of the band gaps, each of the anatase type titanium oxide and the rutile type titanium oxide absorb substantially the ultraviolet light alone, though the rutile type titanium oxide can further absorb the visible light having a wave range close to that of the ultraviolet light.

As described above, the rutile type titanium oxide is capable of absorbing the light having a broader wave range and, thus, is considered to exhibit the photocatalytic function higher than that exhibited by the anatase type titanium oxide. However, the anatase type titanium oxide actually exhibits the photocatalytic function higher than that exhibited by the rutile type titanium oxide. The reason for the particular phenomenon is considered to be as follows.

As shown in FIG. 7, the energy level of the valence band for each of the anatase type titanium oxide and the rutile type titanium oxide is located in a very deep position. Therefore, the positive hole generated by the light absorption of titanium oxide has a sufficiently high oxidizing power. To be more specific, the oxidizing power of the positive hole of titanium oxide is markedly stronger than the oxidizing power of the general oxidizing agent of hydrogen peroxide, as shown in FIG. 7.

On the other hand, the energy level of the conduction band for each of the anatase type titanium oxide and the rutile type titanium oxide is close to the oxidation-reduction potential of hydrogen ($H^+$, $H_2$), as shown in FIG. 7. Therefore, each of these titanium oxides has a relatively weak reducing power. However, the energy level of the conduction band for the anatase type titanium oxide is located in the further negative position than the energy level of the conduction band for the rutile type titanium oxide, with the result that the reducing power of the anatase type titanium oxide is stronger than the reducing power of the rutile type titanium oxide. Such being the situation, it is considered reasonable to understand that the anatase type titanium oxide exhibits the photocatalytic function higher than that performed by the rutile type titanium oxide.

It is known to the art that the brookite type titanium oxide shown in FIG. 6C exhibits a considerably high photocatalytic activity. It is also known to the art that the brookite type titanium oxide has a band gap of about 3.2 eV. It follows that, even in the case of using the abrasive particles 18 containing the brookite type titanium oxide, it is possible to obtain the photocatalytic function substantially equal to that obtained in the case of using the abrasive particles 18 containing the anatase type titanium oxide.

Incidentally, the abrasive particles 18 containing titanium oxide exhibits the photocatalytic function when the abrasive particles 18 absorbs the ultraviolet light having a wavelength not longer than about 380 nm among the ultraviolet light having a wavelength region ranging between 200 nm and 400 nm. Also, the photocatalytic function of the abrasive particles 18 containing titanium oxide is intensified with decrease in the wavelength of the irradiating ultraviolet light.

The CMP apparatus capable of using the slurry 7 described above will now be described.

Figure 8:
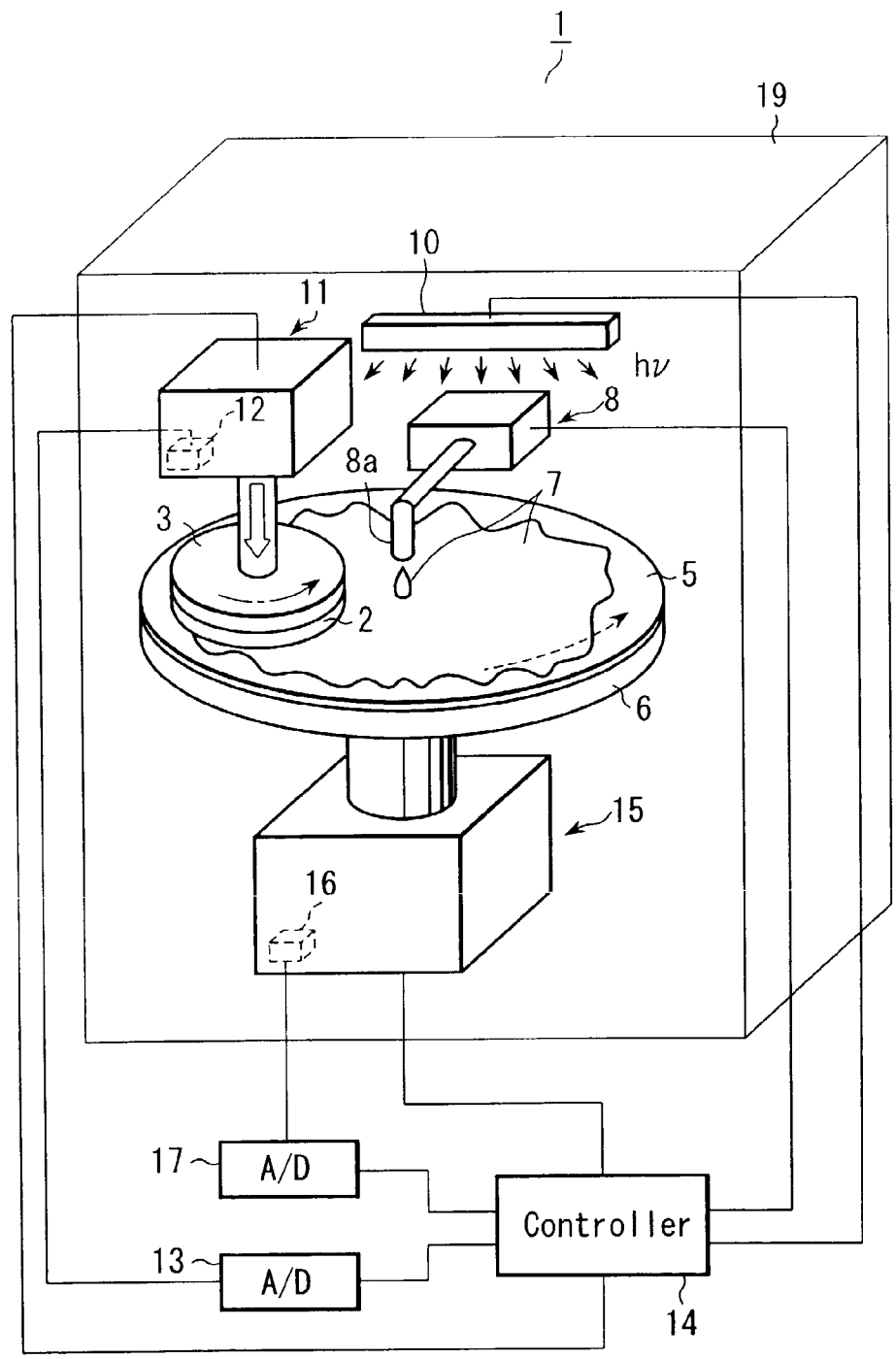
FIG. 8 schematically exemplifies a CMP apparatus that permits using the slurry shown in FIGS. 3A and 3B.

FIG. 8 schematically exemplifies a CMP apparatus 1 capable of using the slurry 7 shown in FIGS. 3A and 3B. As shown in the drawing, the CMP apparatus 1 comprises a casing 19. Housed in the casing 19 are a head (or carrier) 3 used as a substrate holding tool, a turntable 6 used as a polishing tool, and a slurry supply device 8.

The head 3 is rotatably mounted to a head driving device 11, and the back surface of a target substrate 2 to be polished is detachably mounted to the head 3. The turntable 6 is rotatably mounted to a table driving device 15 in a manner to face the head 3, and a polishing pad (or polishing cloth) 5 used as a polishing member is detachably mounted to that surface of the turntable 6 which faces the head 3. Further, the slurry supply device 8 is constructed such that the slurry 7 is supplied from a supply nozzle 8a of the slurry supply device 8 onto the polishing pad 5. Incidentally, the head driving device 11 and the turntable driving device collectively constitute a driving mechanism.

A sensor 12 for the head and a sensor 16 for the table are housed in the head driving device 11 and the table driving device 15, respectively. The head sensor 12 serves to detect the driving state of the head 3 such as the load applied to the head 3 (the rotating shaft torque and/or the axial load of the head 3) and the rotating speed of the head 3. On the other hand, the table sensor 16 serves to detect the load applied to the table 6 (the rotating shaft torque of table 6), which is derived from, for example, the frictional force produced during the polishing operation, and the rotating speed of the table 6. These sensors 12 and 16 are electrically connected to a controller 14 through A/D converters 13 and 17, respectively.

The controller 14 is electrically connected to the slurry supply device 8, the head driving device 11 and the table driving device 15, and serves to control appropriately the load applied to the head 3, the rotating speed (the number of revolutions per unit time) of the head 3, the rotating speed (the number of revolutions per unit time) of the table 6, and the supply amount and the supply frequency of the slurry 7 on the basis of, for example, the signals generated from the sensors 12, 16 and a program set in advance.

The CMP apparatus 1 further comprises a light irradiation device 10 such as an ultraviolet lamp. The light irradiation device 10 serves to irradiate the slurry 7 on the polishing pad 5 with light, e.g., ultraviolet light, capable of inducing the photocatalytic function in the abrasive particles 18. The light irradiation device 10 is electrically connected to the controller 14 so as to permit the on/off operation of the light irradiation device 10, the intensity of the light emitted from the light irradiation device 10, and the spectrum of the light emitted from the light irradiation device 10 to be controlled by the controller 14. It is possible to construct the controller 14 such that, for example, the irradiation/non-irradiation of light can be switched in accordance with the torque of each of the rotating shafts of the head 3 and the turntable 6.

In the CMP apparatus 1 of the construction described above, the casing 19 serves to prevent the slurry 7 from being scattered outward during the polishing operation and to prevent the dust in the air atmosphere from entering the slurry 7. In addition, it is desirable to construct the casing 19 such that the casing 19 serves to prevent the light outside the casing 19 from inducing an undesired photocatalytic function in the slurry 7 and from denaturing the slurry 7. In other words, it is desirable for the casing 19 to shield the light inducing the photocatalytic function in the slurry 7.

It is possible to carry out the CMP treatment, for example, as follows by using the CMP apparatus 1 of the construction described above.

Figure 9:
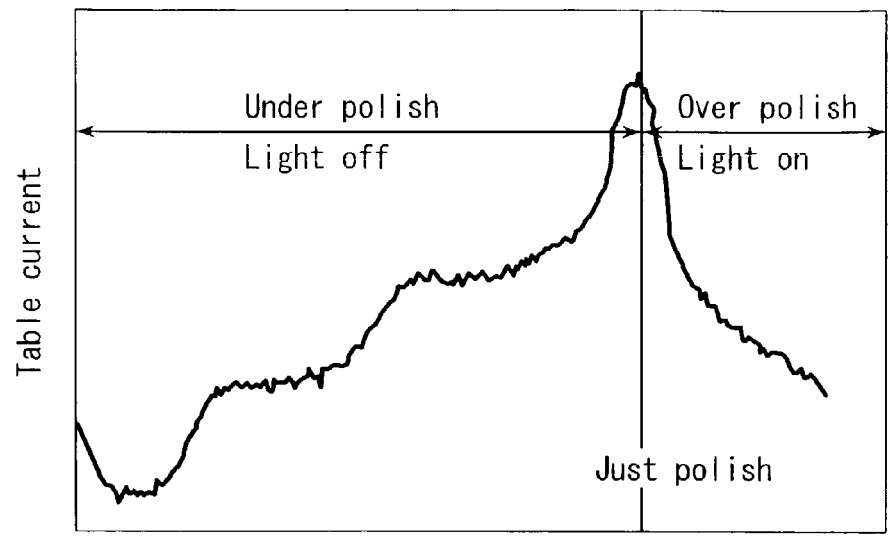
FIG. 9 is a graph exemplifying the relationship between the polishing time and the load applied to the table, which can be observed when a CMP treatment is carried out by using the CMP apparatus shown in FIG. 8.

FIG. 9 is a graph exemplifying the relationship between the polishing time and the load applied to the table 6, which can be observed during the CMP treatment performed by using the CMP apparatus 1 of the construction shown in FIG. 8. The polishing time (duration of polishing) is plotted on the abscissa of the graph, with the torque detected by the table sensor 16 being plotted on the ordinate as the output current generated from the sensor 16.

It is possible to estimate the polished state of the target substrate 2 on the basis of the deviation between the set value and the actually measured value of the rotating speed of the turntable 6 and/or the torque of the rotating shaft of the turntable 6. Similarly, it is also possible to estimate the polished state of the target substrate 2 on the basis of the deviation between the set value and the actually measured value of the rotating speed of the head 3 and/or the torque of the rotating shaft of the head 3. Where, for example, the actual rotating speed of the head 3 or the turntable 6 is controlled to be equal to the set value, the motor current value (or the table current value) of the table driving device 15 is changed in accordance with progress of the polishing, as shown in FIG. 9. Therefore, in the case of flattening the metal layer 26 shown in FIG. 4A, it is possible to know the time when the upper surface of the insulating film 24 is exposed to the outside as shown in FIG. 4B, i.e., the just polish state, by monitoring the table current value. Incidentally, it is also possible to estimate whether the polishing has been finished or not by monitoring the table current value.

As described above, it is possible to estimate the state of progress of the polishing by monitoring the table current value. It follows that it is possible to start the operation of the light irradiation device 10 to irradiate the slurry 7 on the polishing pad 5 with light at the time of the just polish state without operating the light irradiation device 10 until the just polish state is reached. Where the degree of dispersion of the abrasive particles 18 in the slurry 7 is increased by the light irradiation using the light irradiation device 10, the polishing rate is higher in the non-irradiation state than in the irradiation state, and the polishing accuracy is higher in the irradiation state than in the non-irradiation state. It follows that it is possible to suppress the generation of the dishing, erosion and scratch and to shorten the polishing time by switching the irradiation/non-irradiation of the light as described above.

Figure 10:
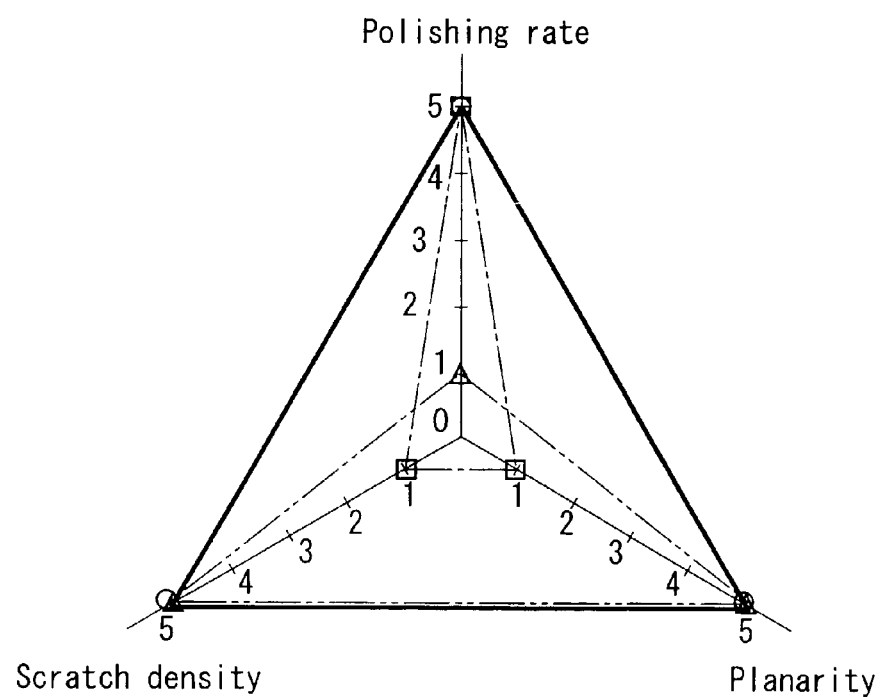
FIG. 10 exemplifies the CMP performance that can be realized in the case of employing the method shown in FIG. 9.

FIG. 10 exemplifies the CMP performance that can be achieved in the case of employing the particular method. The circular marks in the drawing denote the data obtained in the case where titania particles were used as the abrasive particles and the light irradiation/non-irradiation was switched during the CMP treatment as described above. Also, the square marks and the triangular marks in the drawing denote the data obtained in the case of using alumina particles alone or silica particles alone as the abrasive particles. To be more specific, the square marks denote the data in the case where the abrasive particles formed coarse secondary particles, and the triangular marks denote the data in the case where secondary particles were not substantially formed by the abrasive particles. In FIG. 10, concerning the "Polishing rate", a larger number is given when the polishing time is shorter. Also, in FIG. 10, concerning the "Scratch density", a larger number is given when the scratch density is higher. Further, in FIG. 10, concerning the "Planarity", a larger number is given when the degree of the dishing and erosion is lower.

As shown in FIG. 10, where the abrasive particles are made of alumina particles or silica particles, it is impossible to change the degree of dispersion of these abrasive particles during the CMP treatment. Therefore, where the abrasive particles form coarse secondary particles, a very large number of scratches are generated and the planarity is very poor, though the polishing rate is very high. On the other hand, where the degree of dispersion of the abrasive particles is high, the polishing rate is very low, though the scratch generation frequency is very low and the planarity is much better.

On the other hand, in the case of using titania particles as the abrasive particles, it is possible to change the degree of dispersion and the oxidizing power of the abrasive particles by switching the light irradiation/non-irradiation during the CMP treatment. Such being the situation, in the case of switching the light irradiation/non-irradiation during the CMP treatment as described above, it is possible to make the polishing rate very high, to make the scratch generation frequency very low and to make the flatness very high. It follows that it is possible to achieve simultaneously a high polishing rate, a high flatness, a low erosion and a low defect density (scratch-free).

SECOND EMBODIMENT

The second embodiment is equal to the first embodiment described above except the light irradiation method during the CMP treatment.

FIGS. 11A and 11B are cross sectional views schematically exemplifying the CMP treatment according to the second embodiment of the present invention. In this embodiment, a buried metal wiring is formed by using the CMP slurry 7 described previously in conjunction with the first embodiment with reference to FIGS. 3A, 3B, etc. Also, the polishing pad, the dispersion medium 25 and the additives 22 are omitted in FIGS. 11A and 11B.

In the second embodiment, a buried metal wiring is formed, for example, as follows. First, a target substrate 2 to be polished, which is shown in FIG. 11A, is obtained by the method similar to that described previously in conjunction with the first embodiment. Then, the metal film 26 is subjected to the CMP treatment by using the slurry 7 equal to that used in the first embodiment. During the CMP treatment, the back surface of the target substrate 2 is kept irradiated with light such as an ultraviolet light capable of inducing the photocatalytic function in the slurry 7.

In the initial stage of the CMP treatment, the light irradiating the back surface of the target substrate does not reach the slurry 7 interposed between the polishing pad and the substrate 2 because the light is reflected by the metal layer 26. As a result, where the degree of dispersion of the abrasive particles 18 is increased by the light irradiation, the polishing proceeds at a relatively high rate.

If the polishing proceeds to reach substantially the just polish state, it is possible for the major portion of the light irradiating the back surface of the target substrate 2 to reach the slurry 7 interposed between the polishing pad and the substrate 2, with the result that the degree of dispersion of the abrasive particles is increased. It follows that the polishing rate is lowered so as to perform the polishing more accurately.

In the second embodiment, the metal layer 26 plays the role of a shutter or a switch for controlling the light irradiation/non-irradiation so as to make it unnecessary to control electrically the irradiation/non-irradiation. Incidentally, it is possible not to irradiate light in the initial stage of the CMP treatment and to start the light irradiation any time during the under-polished state on the basis of the time from the start-up of the CMP treatment, the table current value, etc.

Also, in the second embodiment, the slurry 7 interposed between the polishing pad and the substrate 2 is irradiated with light as described above. As a result, it is possible to make more uniform and/or to further improve the degree of dispersion and the oxidizing power of the abrasive particles 18 on the surface of the substrate 2.

In the CMP treatment described above, it is possible to use an apparatus prepared by, for example, partly modifying the CMP apparatus 1 shown in FIG. 8.

FIG. 12 is a cross sectional view schematically showing the head 31 of a CMP apparatus that can be utilized in the second embodiment of the present invention. As shown in the drawing, a suction chamber 32 is arranged inside the head 31. The suction chamber 32 is connected to a sucking apparatus (not shown), a pressure control valve (not shown), etc. through an air passageway 34. Also, a backing film 35 for a wafer chuck, which is made of an elastic body and provided with a suction hole 36, is mounted in the head 31 in a manner to close the open portion of the suction chamber 32. The head 31 shown in FIG. 12, which is constructed as described above, is capable of holding the substrate 2 by the vacuum suction.

The head 31 further comprises a light irradiation device 33 such as an ultraviolet lamp, which is arranged inside the suction chamber 32. As denoted by arrows of solid lines, the light irradiating device 33 is capable of emitting light toward the substrate 2 via suction holes 36 formed in the backing film 35.

It is possible to carry out the CMP treatment described above with reference to FIGS. 11A and 11B by using the head 31 described above in place of the head 3 in the CMP apparatus 1 shown in FIG. 8. Incidentally, in the case of using the head 31 in place of the head 3, the CMP apparatus 1 need not be equipped with the light irradiation device 10. Also, it is possible for the light irradiation device 33 included in the head 31 to be electrically connected or not to be electrically connected to the controller 14.

THIRD EMBODIMENT

In each of the first and second embodiments described above, the change in the degree of dispersion of the abrasive particles 18 is utilized mainly as the photocatalytic function of the abrasive particles 18, and the degree of the dispersion of the abrasive particles is changed during the CMP treatment. In the third embodiment of the present invention, however, the CMP treatment is carried out by utilizing mainly the oxidizing power of the abrasive particles 18 exhibited by the light irradiation as the photocatalytic function of the abrasive particles.

FIGS. 13A and 13B are cross sectional views schematically exemplifying the CMP treatment according to the third embodiment of the present invention. In the third embodiment, a buried metal wiring is to be formed by using the slurry 7 described previously in conjunction with the first embodiment with reference to FIGS. 3A and 3B. Also, the polishing pad, the dispersion medium 25 and the additives 22 are omitted in FIGS. 13A and 13B.

In the third embodiment, a buried metal wiring is formed, for example, as follows. First, a target substrate 2 to be polished is obtained by the method similar to that described previously in conjunction with the first embodiment. Then, the metal film 26 is subjected to the CMP treatment by using the slurry 7 equal to that used in the first embodiment, as shown in FIGS. 13A and 13B. During the CMP treatment, the slurry 7 supplied onto the polishing pad is kept irradiated with light such as an ultraviolet light, which is capable of inducing a photocatalytic function in the slurry 7.

Where the degree of dispersion or the oxidizing power of the abrasive particles 18 is increased by the light irradiation, the abrasive particles 18 maintain a high degree of dispersion while the slurry is kept irradiated with light, with the result that the abrasive particles 18 do not form large secondary particles. It follows that the polishing power of the abrasive particles 18 is left low during the light irradiation. In this case, the polishing rate is considered to be markedly lowered as described previously in conjunction with each of the first and second embodiments.

However, if the light irradiating the slurry 7 has a sufficiently high intensity and if the abrasive particles 18 can be brought into a sufficient contact with the polishing surface of the substrate 2, it is possible to utilize the abrasive particles 18 as the oxidizing agent. As a result, the ability of the slurry 7 to oxidize the surface of the metal layer 26 is markedly improved. This implies that the formation of a brittle oxide 43, which can be polished more easily than the metal, is promoted. It follows that it is possible to achieve a sufficiently high polishing rate even if the mechanical polishing power of the abrasive particles 18 is low.

It should also be noted that, since the abrasive particles 18 do not form large secondary particles during the CMP treatment, it is possible to suppress the dishing and erosion and to suppress the scratch generation.

In addition, the oxidation of the surface of the metal layer 26, which is caused by the abrasive particles 18, takes place mainly under the state that the abrasive particles 18 are in contact with the metal layer 26. In other words, the oxidation noted above scarcely takes place in the case where the abrasive particles 18 are positioned apart from the metal layer 26, with the result that it is possible to realize a high flatness. This will now be described with reference to FIGS. 14 and 15.

Figure 14:
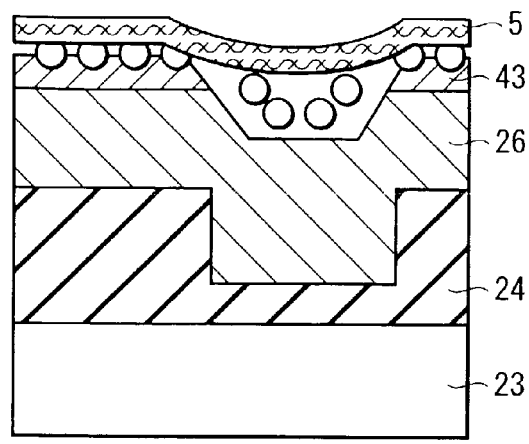
FIG. 14 is a cross sectional view showing the state intermediate between the state shown in FIG. 13A and the state shown in FIG. 13B.

FIG. 14 is a cross sectional view showing the state intermediate between the state shown in FIG. 13A and the state shown in FIG. 13B. Incidentally, the dispersion medium 25 and the additives 22 are omitted in FIG. 14 as in FIGS. 13A and 13B. However, the polishing pad 5 is shown in FIG. 14.

As shown in FIG. 14, during the CMP treatment, the polishing pad 5 is deformed along the groove formed on the polishing surface, with the result that the side walls and the bottom surface of the groove are also polished by the CMP treatment. However, the surface of the metal layer 26 is scarcely oxidized by the abrasive particles 18 when the abrasive particles 18 are positioned apart from the metal layer 26, as described above. Since the polishing pad 5 is not deformed to permit the abrasive particles 18 to be pressed strongly against the side walls and the bottom surface of the groove, the oxide film 43 is more unlikely to be formed on the side walls and the bottom surface of the groove than on the upper surface of the metal layer 26. In other words, the side walls and the bottom surface of the groove are maintained under the state that is unlikely to be polished. It follows that it is possible to suppress the polishing of the side walls and the bottom surface of the groove and to polish selectively the upper surface of the metal layer 26 so as to realize a better planarity.

Figure 15:
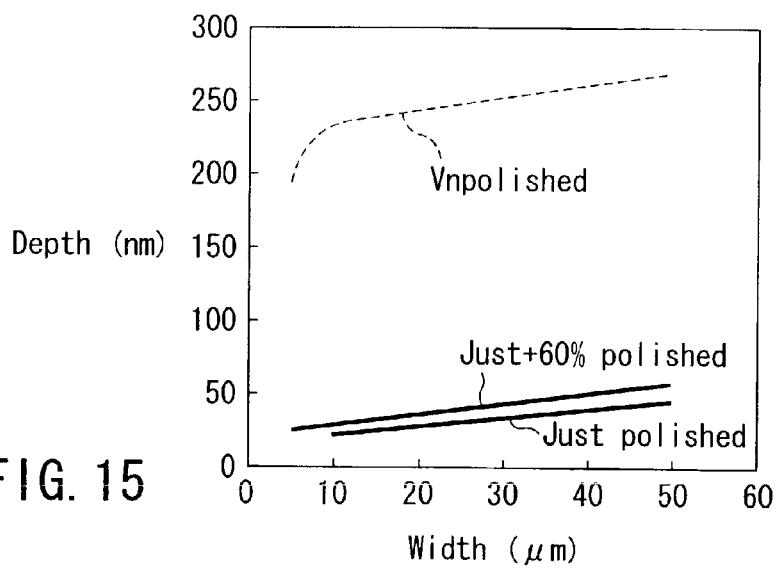
FIG. 15 is a graph showing the relationship between the width and the flatness of the buried wiring.

FIG. 15 is a graph showing the relationship between the width and the flatness of the buried wiring. In the graph of FIG. 15, the width of the wiring 26 is plotted on the abscissa, with the depth of the groove on the polishing surface of the target substrate 2 being plotted on the ordinate. The data given in FIG. 15 were obtained under the conditions given below. Specifically, a slurry containing about 3% by weight of anatase type titanium oxide particles 18 having a primary particle diameter of about 20 nm was used as the slurry 7. Also, IC1000/Suba400 manufactured by Rodel Inc. was used as the polishing cloth (polishing pad). In performing the CMP treatment, a mercury lamp of 500 W was kept lit. The load was about 2.9 N/m$^2$ (300 gf/cm$^2$). The rotating speed of the head 3 was about 100 rpm. The rotating speed of the turntable was about 100 rpm. Further, the slurry flow rate was set at 200 cc/min. A copper buried wiring (Cu damascene wiring) 26 was formed under the conditions given above.

As shown in FIG. 15, the third embodiment makes it possible to achieve a better planarity at the just polished stage. In addition, a better planarity is maintained even at the over-polished stage at which 60% of additional polishing was performed from the just polished stage. It follows that, in the third embodiment, it is unnecessary to control with a high precision the timing of stopping the polishing for realizing a better planarity.

As described previously, the surface of the metal layer 26 is scarcely oxidized by the abrasive particles 18 when the abrasive particles 18 are positioned apart from the metal layer 26. This is useful in various steps included in the manufacturing process of a semiconductor device.

Figure 16A:
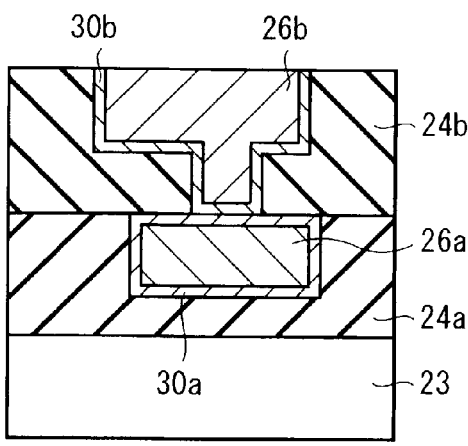
FIG. 16A is a cross sectional view schematically exemplifying another CMP treatment according to the third embodiment of the present invention.
Figure 16B:
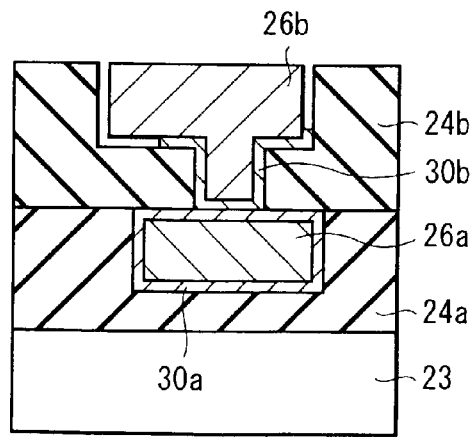
FIG. 16B is a cross sectional view schematically exemplifying the conventional CMP treatment.

FIG. 16A is a cross sectional view schematically exemplifying another CMP treatment according to the third embodiment of the present invention. On the other hand, FIG. 16B is a cross sectional view schematically exemplifying a conventional CMP treatment. The structure shown in each of FIGS. 16A and 16B includes a multi-layered wiring. To be more specific, an interlayer insulating film 24a is formed on a semiconductor substrate 23 such as a Si substrate, and a groove is formed in the insulating film 24a. A metal layer 26a containing a metal such as Cu as a main component is buried in the groove formed in the insulating film 24a. The metal layer 26a buried in the groove constitutes a lower layer wiring. A barrier layer 30a such as a TaN layer is formed on each of the bottom surface, the side walls and the upper surface of the metal layer 26a. An interlayer insulating film 24b is formed on the insulating film 24a, and a via hole and a groove are formed in the interlayer insulating film 24b. These via hole and groove are filled with a metal layer 26b containing a metal such as Cu as a main component such that the metal layer 26b constitutes an upper layer wiring and a via plug. A barrier metal layer 30b such as a WN layer is formed by, for example, a sputtering method on each of the side surface of that portion of the metal layer 26b which constitutes the plug and the bottom surface and the side walls of that portion of the metal layer 26b which constitutes the upper layer wiring. Incidentally, the "WN layer" noted above represents a layer containing tungsten nitride as a main component.

It should be rioted that the upper layer wiring arid the via plug noted above are formed by the following method. Specifically, first, the barrier layer 30b such as a WN layer is formed by a sputtering method on the surface of the insulating layer 24b having the via hole and the groove formed therein. Next, the via hole and the groove are buried with the metal layer 26b. Then, the upper surface is polished by the CMP method until the upper surface of the insulating film 24b is exposed to the outside. The material used for forming the barrier layer 30b such as WN tends to be etched more easily with an oxidizing agent than the material used for forming the metal layer 26b such as Cu. Therefore, in the prior art, that portion of the barrier layer 30b which is interposed between the metal layer 26b and the insulating film 24b is etched during the CMP treatment as shown in FIG. 16B, with the result that the metal layer 26b tends to be peeled off easily.

In the method according to the third embodiment, however, the surface of the metal layer 26b is scarcely etched by the abrasive particles 18 in the case where the abrasive particles 18 are positioned apart from the metal layer 26b. Since the abrasive particles 18 is markedly larger than the oxidizing agent particle, it is substantially impossible for the abrasive particles 18 to enter the clearance between the metal layer 26b and the insulating film 24b. Therefore, it is possible to suppress the etching of that portion of the barrier layer 30b which is positioned between the metal layer 26b and the insulating layer 24b as shown in FIG. 16A, if the method according to the third embodiment is employed for the CMP treatment for forming the upper layer wiring and the via plug. It follows that it is possible to prevent the peeling of the metal layer 26*b*.

As described above, a high oxidizing power that can be obtained by irradiating the abrasive particles 18 with light is utilized in the method according to the third embodiment. The principle of changing the oxidizing power of the abrasive particles 18 by irradiating the abrasive particles 18 with light has already been described briefly in conjunction with the first embodiment. The principle will now be described in detail, covering the case where titanium oxide particles constitute the abrasive particles 18.

Figure 17:
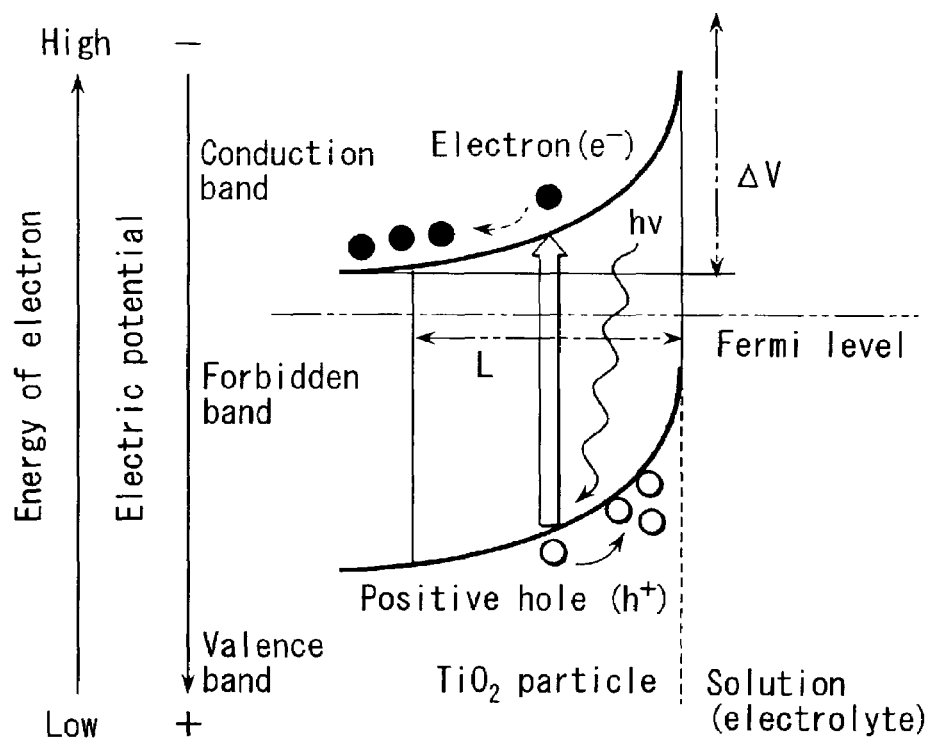
FIG. 17 shows the energy band of titanium oxide.

FIG. 17 shows the energy band of titanium oxide.

Titanium oxide is a kind of n-type semiconductor. Therefore, electrons move from the surface of the titanium oxide particles 18 into an electrolytic solution containing water 25 and an acid 22 within the slurry 7. As a result, the energy band is elevated by $\Delta V$ on the surface of the titanium oxide particles 18, as shown in FIG. 17. In other words, a curvature of band (a Schottky barrier) having $\Delta V$ represented by "$\Delta V = 2\pi n_0/\kappa \cdot L^2$", where $n_0$ represents the concentration of the donor level, $\kappa$ represents the dielectric constant, and L represents the barrier height, is generated in the vicinity of the surface of the titanium oxide particles 18 contained in the slurry 7 under the state of equilibrium.

As described previously in conjunction with the first embodiment, if the anatase type titanium oxide is irradiated with an ultraviolet light having an energy not lower than about 3.2 eV, the electron is excited from the valance band toward the conduction band as denoted by a white arrow in FIG. 17. As a result, positive holes the number of which is equal to the number of excited electrons are generated in the valence band of titanium oxide. The positive holes thus generated are drifted along the band curve toward a lower potential region. On the other hand, the excited electrons are drifted along the band curve toward a higher potential region. Incidentally, a chemical reaction denoted by the reaction formula "$OH^- + h^+ \rightarrow .OH$" is generated in this step on the surface of the titanium oxide particles 18.

As denoted by the reaction formula given above, the hydroxy ion ($OH^-$) is oxidized by the positive hole so as to generate a hydroxy radical (.OH) having a very high oxidizing power. It is generally considered reasonable to understand that the oxidizing power of titanium oxide is increased by the light irradiation based on the principle described above.

The oxidizing power of the titanium oxide particles 18 described above is related to the primary particle diameter of the titanium oxide particles 18, as described in the following. As described above, the positive holes generated by irradiating the titanium oxide particles 18 with light move toward the surface of the particle. However, since $\Delta V$ is proportional to $L^2$, $\Delta V$ is rendered very small if the diameter of the primary particle of the titanium oxide particles 18 is smaller than about 5 nm, resulting in failure to obtain a driving force large enough to permit the positive hole to move to the surface of the particle. It should also be noted that, if the diameter of the primary particle of the titanium oxide particles 18 exceeds about 100 nm, it takes a long time for the positive hole to reach the surface of the particle, with the result that the probability of recombination of the positive hole with the electron is increased. It follows that, in this case, the number of positive holes which reach the surface of the titanium oxide particles 18 is decreased. Such being the situation, it is desirable for the primary particle diameter of the titanium oxide particles 18 to be distributed to fall within a range of about 5 nm to about 100 nm in the case of utilizing the titanium oxide particles 18 as the oxidizing agent.

It should also be noted that it is necessary for the light irradiating the slurry 7 to have a sufficiently high intensity in the case of utilizing the abrasive particles 18 as the oxidizing agent. This will now be described with reference to FIG. 18.

Figure 18:
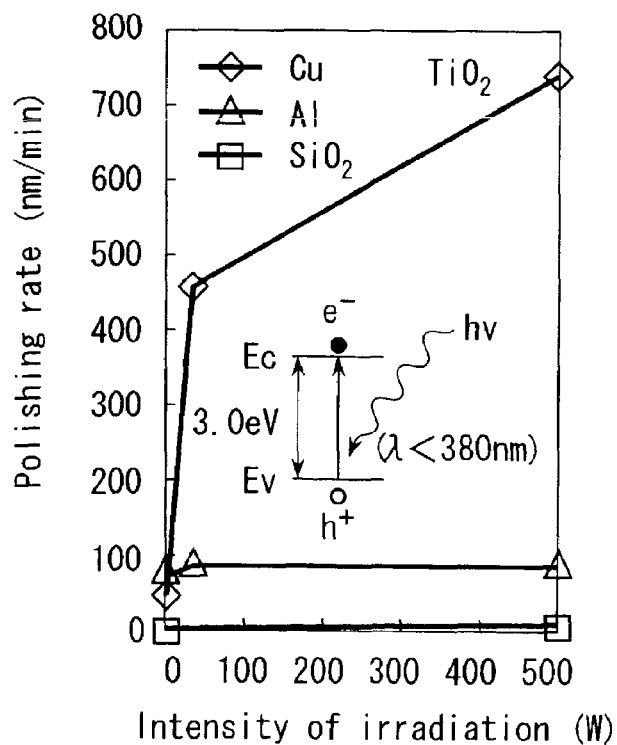
FIG. 18 is a graph showing the relationship between the intensity of the light irradiating the slurry and the polishing rate.

FIG. 18 is a graph showing the relationship between the intensity of the light irradiating the slurry 7 and the polishing rate. In the graph of FIG. 18, the intensity of the irradiating light is plotted on the abscissa, with the polishing rate being plotted on the ordinate. Incidentally, the data given in FIG. 18 was obtained in the case of forming a copper buried wiring (Cu damascene wiring) 26 by the CMP method under the conditions substantially equal to those described previously in conjunction with FIG. 15.

As shown in FIG. 18, the polishing rate is increased with increase in the intensity of the ultraviolet light used for the irradiating the slurry 7. Incidentally, the polishing rate of the Cu layer 26 was about 45 nm/min in the case where the slurry 7 was not irradiated with the ultraviolet light during the Cu-CMP treatment. On the other hand, where the slurry 7 was irradiated with an ultraviolet light by using a fluorescent lamp of 30 W during the Cu-CMP treatment, the polishing rate of the Cu layer 26 was about 450 nm/min, which was about 10 times as high as that in the case where the slurry 7 was not irradiated with the ultraviolet light. Further, where the slurry 7 was kept irradiated with an ultraviolet light during the Cu-CMP treatment by using a mercury lamp of 500 W, the light emitted from the mercury lamp containing a greater amount of the ultraviolet component, the polishing rate of the Cu layer 26 was about 750 nm/min.

Incidentally, FIG. 18 shows the data relating to the CMP treatment applied to an Al layer and the data relating to a $SiO_2$ layer in addition to the data relating to the CMP treatment applied to the Cu layer. As apparent from the data given in FIG. 18, it was possible to achieve a very high polishing rate in the case where the Cu layer constituted the polishing layer, compared with the case where the Al layer or the $SiO_2$ layer constituted the polishing layer.

Figure 19A:
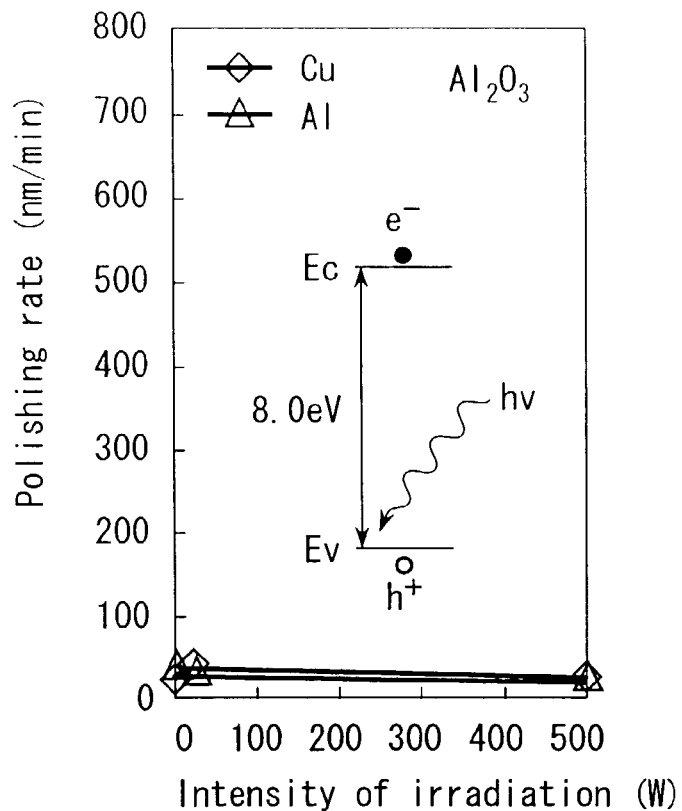
FIGS. 19A and 19B are graphs each showing the relationship between the intensity of the light irradiating the slurry and the polishing rate, covering the cases where alumina particles or silica particles are used as the abrasive particles.
Figure 19B:
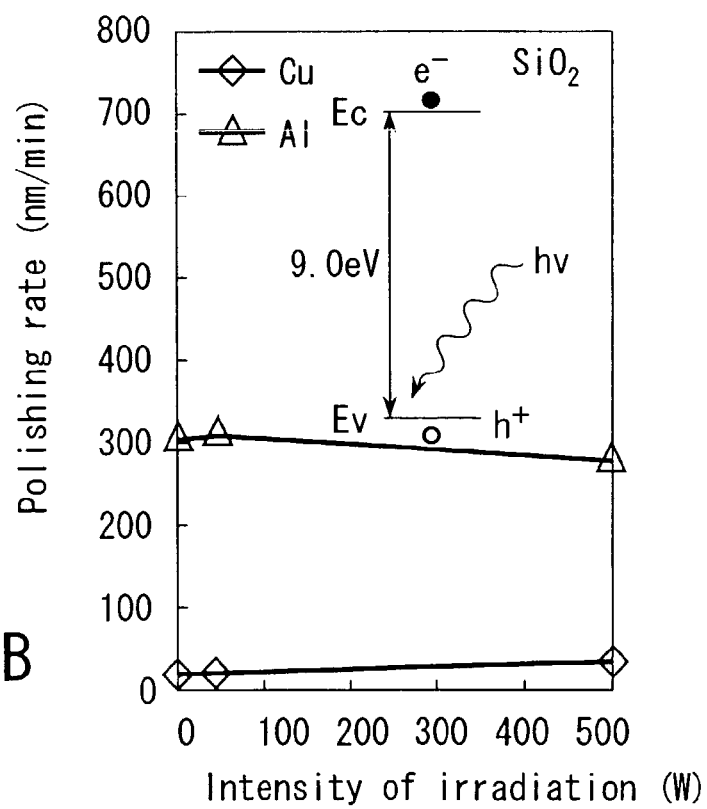

FIGS. 19A and 19B are graphs each showing the relationship between the intensity of the light irradiating the slurry 7 and the polishing rate, covering the case where alumina particles or silica particles were used as the abrasive particles. In each of these graphs, the intensity of the irradiating light is plotted on the abscissa, with the polishing rate being plotted on the ordinate. Incidentally, the data given in FIGS. 19A and 19B were obtained by the CMP treatment performed under the conditions equal to those described previously in conjunction with FIG. 18, except that alumina particles and silica particles were used as the abrasive particles.

As apparent from FIG. 19A, the effect of the ultraviolet light irradiation on increasing the polishing rate was scarcely produced in the case of using the alumina particles as the abrasive particles 18. Also, the effect of the ultraviolet light irradiation on increasing the polishing rate was scarcely produced in the case of using the silica particles as the abrasive particles 18, as apparent from FIG. 19B. It should be noted that each of alumina and silica is an insulator and, thus, has a large band gap, compared with the energy of the ultraviolet light, resulting in failure to increase the polishing rate in the case of using the alumina particles or the silica particles as the abrasive particles 18.

As described above, in the case of utilizing the abrasive particles 18 as an oxidizing agent, the polishing rate is related to the intensity of the light irradiating the slurry 7. However, in the case of utilizing the abrasive particles 18 as an oxidizing agent, the factors affecting the polishing rate are not limited to the intensity of the light irradiating the slurry 7. For example, the concentration of the abrasive particles 18 in the slurry 7 and the pH value of the slurry 7 also affect the polishing rate.

Figure 20:
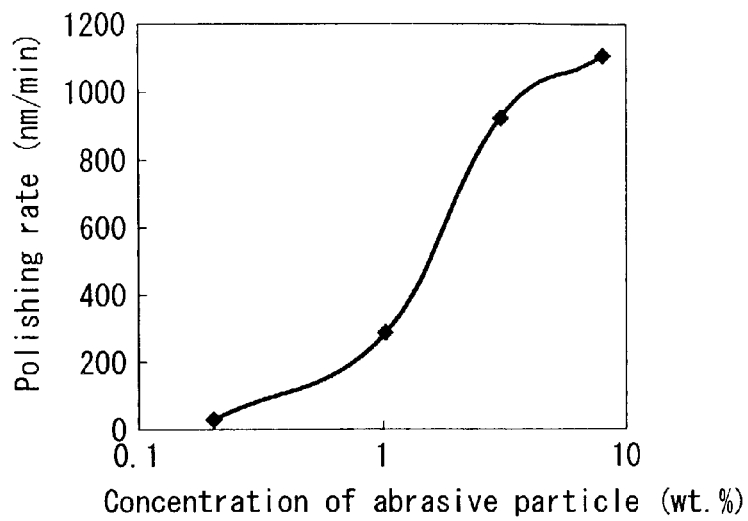
FIG. 20 is a graph showing the relationship between the concentration of the abrasive particles in the slurry 7 and the polishing rate.

FIG. 20 is a graph showing the relationship between the concentration of the abrasive particles 18 in the slurry 7 and the polishing rate. In the graph of FIG. 20, the concentration of the abrasive particles 18 in the slurry 7 is plotted on the abscissa, with the polishing rate being plotted on the ordinate. Also, the data given in FIG. 20 was obtained under the conditions substantially equal to those described previously in conjunction with FIG. 15 except the concentration of the abrasive particles 18 in the slurry 7.

As shown in FIG. 20, the polishing rate is increased with increase in the concentration of the abrasive particles 18 in the case where the concentration of the abrasive particles 18 in the slurry 7 falls within a range of about 0.1% by weight to about 10% by weight. Particularly, it was possible to realize a high polishing rate not lower than about 300 nm/min in the case where the concentration of the abrasive particles in the slurry 7 is not lower than about 1% by weight.

Figure 21:
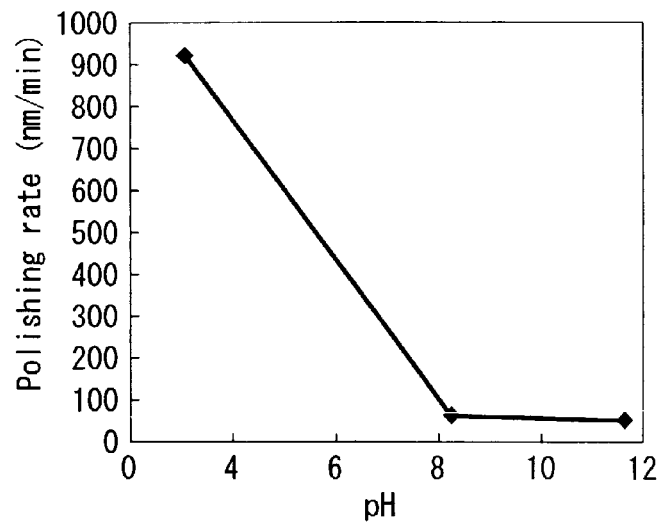
FIG. 21 is a graph showing the relationship between the pH value of the slurry 7 and the polishing rate.

FIG. 21 is a graph showing the relationship between the pH value of the slurry 7 and the polishing rate. In the graph of FIG. 21, the pH value of the slurry 7 is plotted on the abscissa, with the polishing rate being plotted on the ordinate. Also, the data given in FIG. 21 was obtained under the conditions substantially equal to those described previously in conjunction with FIG. 15 except the pH value of the slurry 7.

As shown in FIG. 21, the polishing rate is increased with decrease in the pH value of the slurry 7 in the case where the pH value is not larger than about 8. Particularly, it was possible to achieve a high polishing rate not lower than about 600 nm/min in the case where the pH value of the slurry 7 is not larger than about 5, which is the isoelectric point of the titanium oxide particles 18. Incidentally, the polishing rate is markedly low in the case where the pH value of the slurry 7 is larger than about 7. It should be noted that, under the large pH value noted above, a $Cu(OH)_x$ film, which is unlikely to be polished, is formed on the surface of the Cu layer 26, leading to the markedly low polishing rate noted above.

The polishing rate is also dependent on the rotating speed, i.e., the number of revolutions per minutes (rpm), of the turntable 6. The rotating speed of the turntable 6, which affects the polishing rate in the general CMP treatment, seriously affects the polishing rate in the method according to the third embodiment, because the abrasive particles 18 are utilized as the oxidizing agent in the method according to the third embodiment. In other words, if the abrasive particles 18 irradiated with light are not supplied promptly onto the polishing surface, the positive holes generated by the light irradiation are not utilized for the oxidation of the metal but are recombined with electrons.

Figure 22:
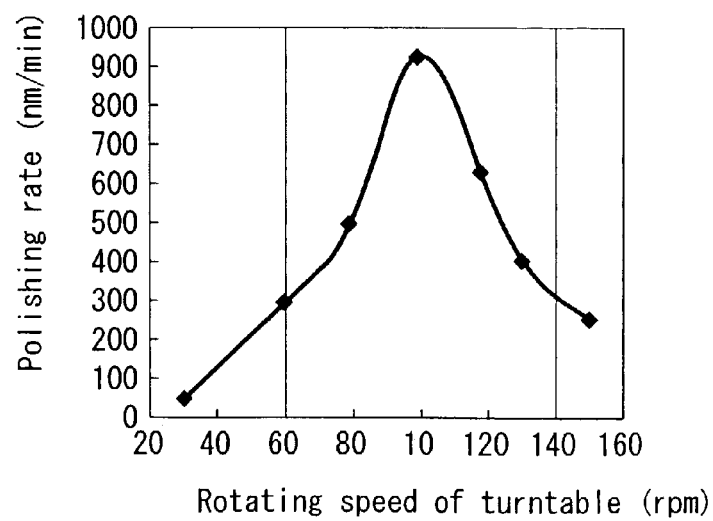
FIG. 22 is a graph showing the relationship between the rotating speed of the turntable and the polishing rate.

FIG. 22 is a graph showing the relationship between the rotating speed of the turntable and the polishing rate. In the graph of FIG. 22, the rotating speed of the turntable is plotted on the abscissa, with the polishing rate being plotted on the ordinate. Also, the data given in FIG. 22 was obtained under the conditions substantially equal to those described previously in conjunction with FIG. 15 except the rotation speed of the turntable 6.

As shown in FIG. 22, a high polishing rate, which is not lower than 300 nm/min, is obtained in the case where the rotating speed of the turntable 26 falls within a range of 60 rpm to 140 rpm. Also, a further higher polishing rate, which is not lower than 600 nm/min, was obtained in the case where the rotating speed of the turntable 6 falls within a range of 80 rpm to 120 rpm. Where the rotating speed of the turntable 6 is set at a value not lower than the lower limit of the range noted above, a major portion of the positive holes are not recombined with electrons so as to be utilized for the oxidation of the metal, with the result that it is possible to obtain a high polishing rate as described above. It should also be noted that, where the rotating speed of the turntable 6 is higher than the upper limit of the range noted above, the amount of the slurry 7 supplied to the polishing surface is decreased by the excessively high centrifugal force so as to lower the polishing rate.

The polishing rate is also dependent greatly on the kind of the polishing pad used.

FIG. 23 is a graph showing the relationship between the kind of the polishing pad and the polishing rate. The mark "no-C" given in the graph of FIG. 23 denotes the data obtained in the case where IC1000/Suba400, which does not contain a conductive component, was used as the polishing pad 5, and a copper buried wiring was formed under the conditions substantially equal to those described previously in conjunction with FIG. 15. On the other hand, the mark "C" given in the graph of FIG. 23 denotes the data obtained in the case where POLITEX manufactured by Rodel Inc. which contains carbon was used as the polishing pad 5, and a copper buried wiring was formed under the conditions substantially equal to those described previously in conjunction with FIG. 15.

As shown in FIG. 23, it was possible to realize a high polishing rate of about 1 μm/min in the case of using the polishing pad 5 that did not contain a conductive component. On the other hand, in the case of using the polishing pad 5 containing a conductive component, the polishing rate was very low, i.e., about 50 nm/min. Clearly, the polishing rate is markedly dependent on the kind of the polishing pad 5 used. It should be noted in this connection that, in the case where a conductive component such as carbon is contained in the polishing pad 5, the positive holes generated when the abrasive particles 18 are irradiated with light can be recombined with the free electrons in the conductive component, leading to the low polishing rate. It is possible to suppress sufficiently the decrease of the polishing rate derived from the recombination noted above by using a polishing pad containing a conductive component such as carbon in an amount not larger than 3% by weight. Further, it is possible to prevent substantially completely the decrease of the polishing rate derived from the recombination noted above by using a polishing pad that does not contain a conductive component such as carbon.

FOURTH EMBODIMENT

In the case of utilizing the abrasive particles 18 as an oxidizing agent as described in conjunction with the third embodiment, a residual metal tends to be generated. This will now be described with reference to FIGS. 24A and 24B.

FIGS. 24A and 24B are cross sectional views schematically showing the residual metal that is generated in the case of performing the CMP treatment by the method according to the third embodiment of the present invention. Incidentally, in FIGS. 24A and 24B, a barrier metal layer such as a WN layer (not shown), which is similar to that described previously in conjunction with FIGS. 16A and 16B, is, formed on each of the bottom surface and the side surface of the Cu layer 26.

As described previously, the degree of dispersion and the oxidizing power of the titanium oxide particles 18 are improved if the titanium oxide particles 18 are irradiated with light. Therefore, the degree of dispersion of the titanium oxide particles 18 is considered to be high in the slurry 7 supplied onto the polishing pad. However, in the method described previously in conjunction with the third embodiment, the titanium oxide particles 18 are not necessarily dispersed uniformly in the slurry 7 interposed between the polishing pad and the target substrate, as shown in FIG. 24A, with the result that it is possible for the polishing of the Cu layer 26 to proceed nonuniformly.

If the polishing of the Cu layer 26 proceeds nonuniformly, recessed portions and protruding portions are generated on the surface of the Cu layer 26. Where the upper surface of the protruding portion has a small area, it is difficult for the titanium oxide particles 18 to be interposed between the upper surface of the protruding portion and the polishing pad. As a result, the upper surface of the protruding portion is unlikely to be oxidized. In other words, it is more difficult for the $CuO_x$ film 43 to be formed on the upper surface of the protruding portion than on the bottom surface of the recessed portion. It follows that it is possible for an island-shaped Cu layer 26 to remain on the upper surface of the insulating film 24, as shown in FIG. 24B.

It is possible for the island-shaped residual Cu layer 16 to have a maximum height or diameter of about 500 nm. Therefore, where such an island-shaped residual portion has been generated, an electrical short circuiting tends to be generated between the adjacent wirings.

In the fourth embodiment, the polishing is performed by the method substantially equal to the method described previously in conjunction with the third embodiment described previously, except that a nonionic surfactant is further added to the slurry 7 in the fourth embodiment. Where the slurry 7 contains a nonionic surfactant, it is possible to disperse the abrasive particles 18 more uniformly. As a result, it is possible to obtain the effect of uniformly proceeding the polishing of the metal layer 26 in addition to the effects described previously in conjunction with the third embodiment. It follows that it is possible to suppress the generation of the island-shaped residual portion.

FIG. 25 is a graph exemplifying the effect of adding a nonionic surfactant to the slurry 7 on suppressing the generation of the island-shaped residual portion. The data given in FIG. 25 was obtained under the conditions given below. Specifically, a slurry containing about 3% by weight of anatase type titanium oxide particles 18 having a primary particle diameter of about 20 nm was used as the slurry 7 for the CMP treatment. An IC1000/Suba400 was used as the polishing cloth (polishing pad). A mercury lamp of 500 W was kept lit during the CMP treatment. The load was about 300 gf/cm$^2$. The number of revolutions per minute of the head 3 was about 100 rpm. The number of revolutions per minute of the turntable was about 100 rpm. Further, the slurry flow rate was set at 200 cc/min. Under the conditions given above, Cu wirings 26 each having a width of 40 μm were formed 10 μm apart from each other.

FIG. 25 shows the data "no-NS" covering the case where a nonionic surfactant was not added to the slurry 7, and the data "NS" covering the case where acetylene diol (hydrophilic lipophilic balance: HLB=18) was added as a nonionic surfactant to the slurry 7 in a concentration of 0.1% by weight. In the graph of FIG. 25, the number of island-like residual portions, which were recognized when observing a prescribed area, is plotted on the ordinate.

As shown in FIG. 25, 60 island-like residual portions were-generated in the case where the nonionic surfactant was not added to the slurry 7. On the other hand, the number of island-like residual portions was decreased to 7 in the case of adding the nonionic surfactant to the slurry 7.

As described above, it is possible to suppress the generation of the island-like residual portions by adding a nonionic surfactant to the slurry 7 so as to make it possible to suppress generation of the short-circuiting among the wirings and, thus, to markedly improve the yield of manufacture.

Figure 26:
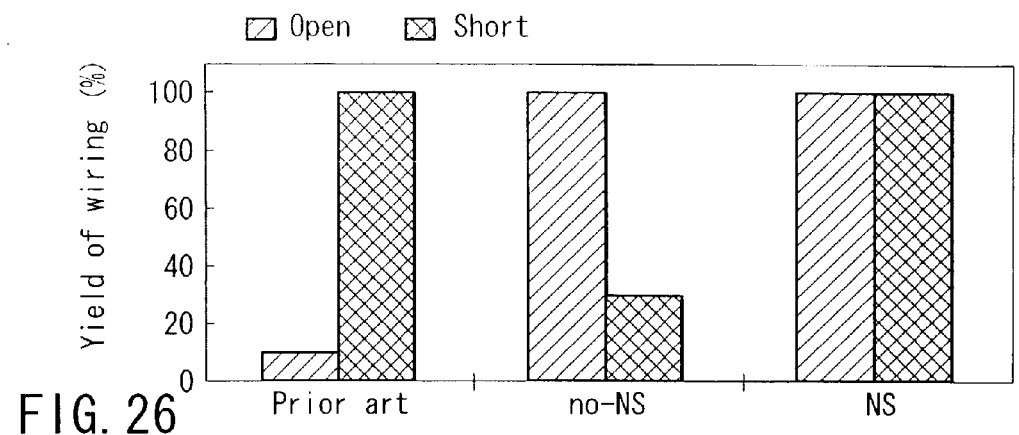
FIG. 26 is a graph exemplifying the effect of adding a nonionic surfactant to the slurry on improving the yield of the manufacture.

FIG. 26 is a graph exemplifying the effect of adding a nonionic surfactant to the slurry 7 on improving the yield of manufacture. The graph of FIG. 26 covers the wiring yield (Short) relating to the electric short circuiting derived from the island-like residual portion, and the wiring yield (Open) relating to the peeling of the wiring described previously in conjunction with FIGS. 16A and 16B. In FIG. 26, "no-NS" and "NS" denote the data obtained in the case where the Cu layer 26 was formed under the conditions substantially equal to those described previously in conjunction with FIG. 25 by using the slurry 7 described previously in conjunction with FIG. 25. Further, "Prior Art" shown in FIG. 26 denotes the data obtained in the case where the Cu wiring 26 was formed under the conditions substantially equal to those described previously in conjunction with FIG. 25 by using the slurry containing alumina particles or silica particles as abrasive particles and also containing an oxidizing agent. As shown in FIG. 26, it is possible to suppress both the electric short circuiting between the adjacent wirings and the peeling of the wiring in the case of using in combination the titanium oxide particles 18 and the nonionic surfactant.

As described above, it is possible to improve the yield in the case of using in combination both the titanium oxide particles 18 and a nonionic surfactant. In addition, a high polishing rate can be achieved in this case. These effects are inherent in the case where a nonionic surfactant is added. In other words, in the case of adding an anionic surfactant or a cationic surfactant to the slurry 7, it is impossible to obtain an effect equivalent to that obtained in the case of adding a nonionic surfactant.

Figure 27:
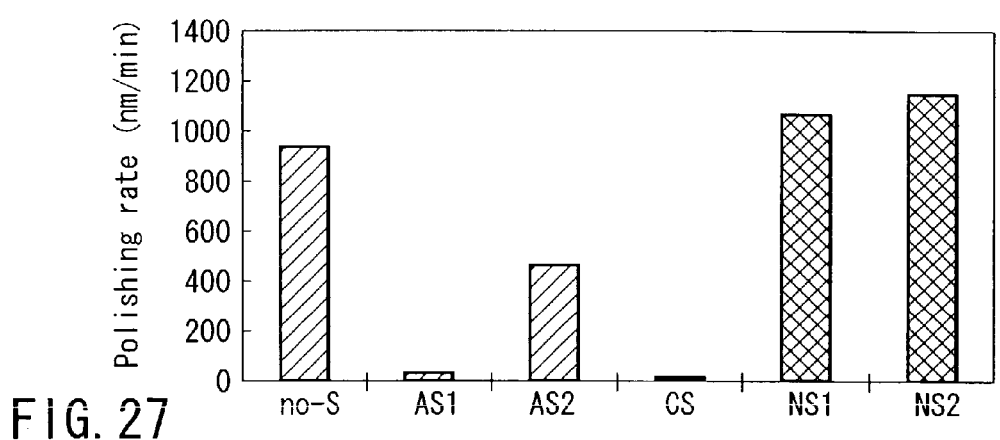
FIG. 27 is a graph showing the relationship between the composition of the slurry and the polishing rate.

FIG. 27 is a graph showing the relationship between the composition of the slurry and the polishing rate. The data given in FIG. 27 is that obtained in the case of forming a Cu wiring 26 under the conditions substantially equal to those described previously in conjunction with FIG. 25 by using a slurry containing about 3% by weight of anatase type titanium oxide particles 18 having a primary particle diameter of about 20 nm. To be more specific, "no-S" denote the data obtained in the case where a surfactant was not added to the slurry. On the other hand, "AS1" and "AS2" denote the data obtained in the cases where a dodecyl benzene sulfonate series anionic surfactant and a polycarboxylic acid series anionic surfactant were added to the slurry, respectively. "CS" denotes the data obtained in the case where an ammonium chloride series cationic surfactant was added to the slurry. "NS1" denotes the data obtained in the case where acetylene diol was added as a nonionic surfactant to the slurry. Further, "NS2" denotes the data obtained in the case where a fluorine-based nonionic surfactant to the slurry.

As shown in FIG. 27, the polishing rate was lowered in the case of adding an anionic surfactant to the slurry 7, compared with the case where a surfactant was not added to the slurry 7. Also, where an anionic surfactant was added to the slurry 7, the titanium oxide particles 18 were agglomerated so as to markedly lower the degree of dispersion of the titanium oxide particles 18. It is considered reasonable to understand that the negatively charged anionic surfactant was adsorbed on the positively charge titanium oxide particles 18 so as to lower the oxidizing power of titanium oxide, leading to the agglomeration of the titanium oxide particles 18.

It is also shown in FIG. 27 that, in the case of adding a cationic surfactant to the slurry 7, the polishing rate was lowered, compared with the case where a surfactant was not added, resulting in failure to obtain a practical polishing rate. It is considered reasonable to understand that the cationic surfactant was adsorbed on the copper oxide layer and the copper oxide was converted into a material that is unlikely to be polished, leading to the decrease in the polishing rate noted above.

The nonionic surfactants used in the fourth embodiment include, for example, acetylene diol, polyoxyethylene lauryl ether, sugar ester, sorbitan ester, glycerin ester, polyoxyethylene alkyl ether, a fatty acid salt, an alkyl sulfate, polyoxyethylene alkyl amine, alkyl trimethyl ammonium salt, alkyl amine salt and a mixture containing at least one of these compounds. In the fourth embodiment, it is also possible to use a fluorine-based nonionic surfactant having a fluoroalkyl group in the molecule.

In the fourth embodiment, it is desirable for the concentration of the nonionic surfactant contained in the slurry 7 to fall within a range of 0.001% by weight to 0.5% by weight. Where the concentration of the nonionic surfactant in the slurry 7 is lower than 0.001% by weight, it is difficult to obtain a prominent effect of uniformly dispersing the abrasive particles 18 in the slurry 7. On the other hand, where the concentration of the nonionic surfactant in the slurry 7 exceeds 0.5% by weight, it is possible for the photocatalytic function of the abrasive particles 18 to be lowered so as to lower the polishing rate.

In the fourth embodiment, the slurry 7 does not contain an oxidizing agent. However, since the abrasive particles 18 are utilized as the oxidizing agent, it is desirable for the pH value of the slurry 7 to be set at a level not higher than 7 as described previously in conjunction with FIG. 21. It is possible to adjust the pH value of the slurry 7 by, for example, adding an inorganic acid such as nitric acid, phosphoric acid, hydrochloric acid or sulfuric acid as a pH adjuster.

FIFTH EMBODIMENT

Where the abrasive particles 18 are utilized as an oxidizing agent as described previously in conjunction with the third embodiment, the pattern density affects the polishing rate. This will now be described with reference to FIG. 28.

Figure 28:
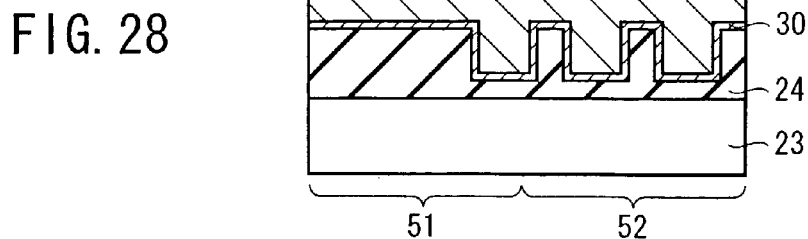
FIG. 28 is a cross sectional view showing the dependence of the polishing rate on the pattern density, which is generated in the case of performing the CMP treatment by the method according to the third embodiment of the present invention.

FIG. 28 is a cross sectional view for explaining the dependence of the polishing rate on the pattern density in the case of performing the CMP treatment by the method according to the third embodiment. Incidentally, in FIG. 28, a reference numeral 30 denotes a barrier layer such as a WN layer.

In a portion 51 having a low pattern density, the abrasive particles 18 are capable of moving relatively freely in the free space between the polishing pad 5 and the Cu layer 26. Therefore, it is possible for the abrasive particles 18 to be present at a sufficiently high density in the portion 51 having a low pattern density. However, in a portion 52 having a high pattern density, the probability for the abrasive particles 18 on the protruding portion of the Cu layer 26 to enter the recessed portion is high. Since it is difficult for the abrasive particles 18 entering the recessed portion to be brought back onto the protruding portion, with the result that the density of the abrasive particles 18 is lowered on the protruding portion. It follows that the polishing rate is markedly lowered in the portion 52 having a high pattern density, compared the portion 51 having a low pattern density.

Figure 29:
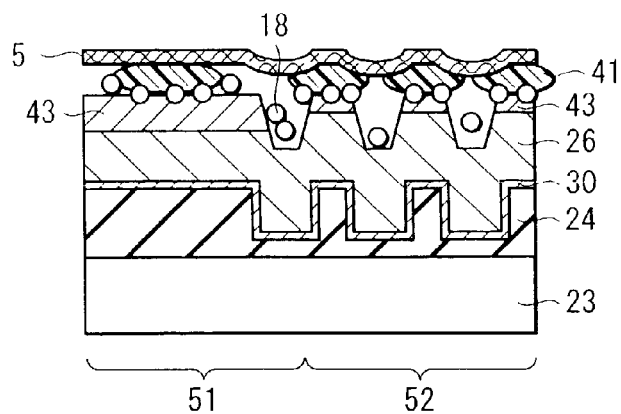
FIG. 29 is a cross sectional view schematically showing the CMP treatment according to a fifth embodiment of the present invention.

FIG. 29 is a cross sectional view schematically showing the CMP treatment according to the fifth embodiment of the present invention. In the fifth embodiment, the polishing is performed by the method substantially equal to the method described previously in conjunction with the third embodiment, except that resin particles 41 are added to the slurry 7. Where the resin particles 41 can be attached easily to both the abrasive particles 18 and the polishing pad 5, it is possible to suppress the entry of the abrasive particles 18 into the recessed portion of the Cu layer 26, as shown in FIG. 29. Therefore, according to the fifth embodiment, it is possible to obtain the effect of increasing the polishing rate of the portion 52 having a high pattern density in addition to the effects described previously in conjunction the third embodiment.

The materials of the resin particles 41 that can be used include, for example, methacrylic resin, phenolic resin, urea resin, melamine resin, polystyrene resin, polyacetal resin, polycarbonate resin and a mixture containing at least one of these resin materials.

The resin particles 41 that can be attached easily to the abrasive particles 18 include, for example, resin particles charged in the polarity opposite to the polarity of the charged abrasive particles 18. For example, in the case of using positively charged titanium oxide particles as the abrasive particles 18, it is possible to use resin particles having a negatively charged functional group, e.g., $COO^-$ group, in the molecule, and resin particles subjected to a surface treatment with silica. It is also possible to use resin particles that can be attached to the abrasive particles 18 or the polishing pad 5 by the mechanofusion phenomenon as the resin particles 41 that can be attached easily to the abrasive particles 18. Since the polishing pad is generally made of an organic material, the resin particles 41 can be strongly attached to the polishing pad 5.

It is desirable for the primary particle diameters of the resin particles 41 to be distributed to fall within a range of 5 nm to 1,000 nm. Where the primary particle diameter of the resin particle 41 is smaller than 5 nm, the effect of attaching the abrasive particle 5 to the polishing pad 5, which is produced by the resin particle 41, is small. On the other hand, if the primary particle diameter of the resin particle 41 exceeds 1,000 nm, it is difficult to disperse uniformly the resin particles 41.

It is desirable for the concentration of the resin particles 41 in the slurry 7 to fall within a range of 0.1% by weight to 3.0% by weight. If the concentration of the resin particles 41 in the slurry 7 is lower than 0.1% by weight, the effect of the resin particle 41 on attaching the abrasive particles 18 onto the polishing pad 5 is small. On the other hand, where the concentration of the resin particles 41 in the slurry 7 exceeds 3.0% by weight, the resin particles 41 tend to lower the polishing power and the oxidizing power of the abrasive particles 18.

Figure 30:
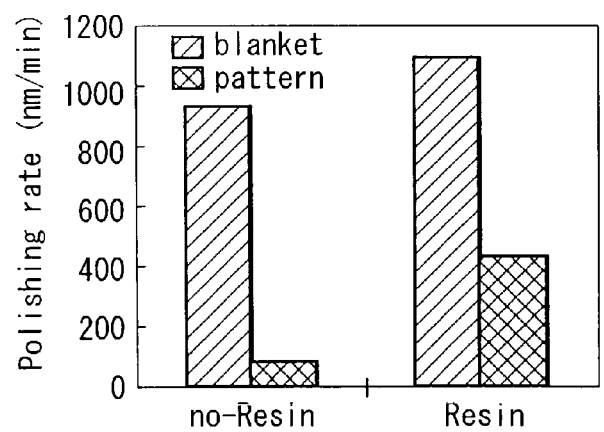
FIG. 30 is a graph exemplifying the effect of adding resin particles to the slurry on increasing the polishing rate.

FIG. 30 is a graph exemplifying the effect of adding the resin particles to the slurry 7 on increasing the polishing rate. The data given in FIG. 30 were obtained under the conditions given below. Specifically, a slurry containing about 3% by weight of anatase type titanium oxide particles 18 having a primary particle diameter of about 20 nm and about 0.5% by weight of PMMA (polymethyl methacrylate) particles 41 having a COO⁻ group on the surface thereof and also having a primary particle diameter of about 200 nm, the pH value of the slurry being adjusted at about 3, was used as the slurry 7 for the CMP treatment. Also, IC1000/Suba400 was used as the polishing cloth (polishing pad). In performing the CMP treatment, a mercury lamp of 500 W was kept lit. The load was about 300 gf/cm$^2$. The rotating speed of the head 3 was about 100 rpm. The rotating speed of the turntable was about 100 rpm. Further, the flow rate of the slurry 7 was set at 200 cc/min. A Cu wiring 26 was formed under the conditions given above.

FIG. 30 shows the data (blanket) on the polishing rate in the portion having a low pattern density, and the data (pattern) on the polishing rate in the portion having a high pattern density. In FIG. 30, "no-Resin" denotes the data obtained in the case of using the slurry that did not contain the resin particles 41. On the other hand, "Resin" denotes the data obtained in the case of using the slurry containing the resin particles 41. As shown in FIG. 30, it was possible to increase the polishing rate in each of the portion having a low pattern density and the portion having a high pattern density by adding the resin particles 41 to the slurry 7. Particularly, in the case of adding the resin particles 41 to the slurry 7, it was possible to markedly increase the polishing rate in the portion having a high pattern density.

SIXTH EMBODIMENT

In the fifth embodiment, the polishing rate was increased by adding the resin particles 41 to the slurry 7. In the sixth embodiment, however, inorganic particles charged in the polarity equal to the polarity of the charged abrasive particles 18 are added to the slurry 7 so as to increase the polishing rate.

Figure 31:
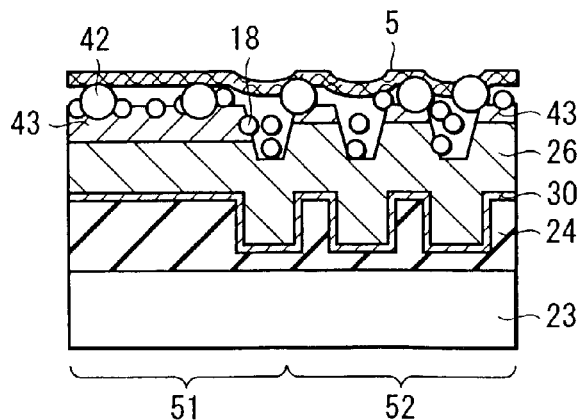
FIG. 31 is a cross sectional view schematically showing the CMP treatment according to a sixth embodiment of the present invention.

FIG. 31 is a cross sectional view schematically showing the CMP treatment according to the sixth embodiment of the present invention. In the sixth embodiment, the polishing is performed as in the third embodiment except that the inorganic particles 42 are further added to the slurry 7. Where the inorganic particles 42 charged in the polarity equal to the polarity of the charged abrasive particles 18 are added to the slurry 7, the mechanical polishing power of the slurry 7 is improved. It follows that the sixth embodiment makes it possible to obtain the effect of increasing the polishing rate in addition to the effects described previously in conjunction with the third embodiment.

Incidentally, it is difficult to increase the polishing rate in the case where the polarity of the charged abrasive particles 18 differs from the polarity of the charged inorganic particles 42. For example, the titanium oxide particles 18 are charged positive, and the alumina particles 42 are also charged positive. It follows that the titanium oxide particles 18 and the alumina particles 42 are unlikely to be agglomerated so as to make it possible to increase the mechanical polishing power of the slurry 7 without decreasing the oxidizing power of the titanium oxide particles. On the other hand, where inorganic particles that are charged negative such as silica particles are used together with the titanium oxide particles 18, these particles are agglomerated together so as to lower the oxidizing power of the titanium oxide particles 18 and to lower the polishing rate.

Where titanium oxide particles are used as the abrasive particles 18 and alumina particles are used as the inorganic particles 42 in the sixth embodiment, it is desirable for the titanium oxide particles 18 and the alumina particles 42 not to be mixed with each other in the powdery state in preparing the slurry 7. In other words, it is desirable to mix a dispersion of the titanium oxide particles 18 with a dispersion of the alumina particles 42, or to add one of the titanium oxide particles 18 and the alumina particles 42 to a dispersion of the other particles. If the titanium oxide particles 18 and the alumina particles 42 are mixed with each other in a powdery state, it is possible for the titanium oxide particles 18 and the alumina particles 42 to be attached to each other to form complex particles. If such complex particles are formed, the surface area of the titanium oxide particles 18 is decreased so as to markedly lower the oxidizing power of he titanium oxide particles 18.

It is desirable for the primary particle diameters of the alumina particles 42 to be distributed to fall within a range of 5 nm to 100 nm. If the primary particle diameter of the alumina particle 42 is smaller than 5 nm, the effect of increasing the mechanical polishing power is decreased. On the other hand, if the primary particle diameter of the alumina particle 42 exceeds 100 nm, scratches tend to be generated.

It is desirable for the concentration of the alumina particles 42 in the slurry 7 to fall within a range of 0.1% by weight to 3.0% by weight. Where the concentration of the alumina particles 42 in the slurry 7 is lower than 0.1% by weight, it is difficult to obtain the effect of increasing the mechanical polishing power. On the other hand, where the concentration of the alumina particles 42 in the slurry 76 exceeds 3.0% by weight, the alumina particles 42 tend to lower the polishing power and the oxidizing power of the abrasive particles 18.

Figure 32:
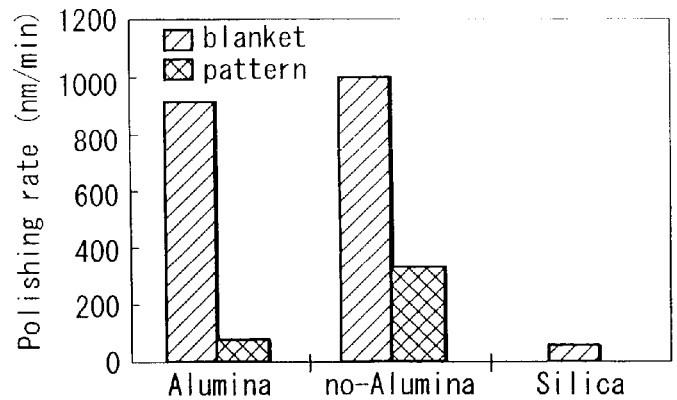
FIG. 32 is a graph exemplifying the effect of adding inorganic particles to the slurry on improving the polishing rate.

FIG. 32 is a graph exemplifying the effect of adding the inorganic particles to the slurry 7 on increasing the polishing rate. The data given in FIG. 32 were obtained under the conditions given below. Specifically, a slurry containing about 3% by weight of anatase type titanium oxide particles 18 having a primary particle diameter of about 20 nm and about 0.5% by weight of γ-alumina particles 42 having a primary particle diameter of about 50 nm, the pH value of the slurry being adjusted at about 3, was used as the slurry 7 for the CMP treatment. Also, IC1000/Suba400 was used as a polishing cloth (polishing pad). In performing the CMP treatment, a mercury lamp of 500 W was kept lit. The load was about 300 gf/cm$^2$. The rotating speed of the head 3 was about 100 rpm. The rotating speed of the turntable was about 100 rpm. Further, the flow rate of the slurry 7 was set at 200 cc/min. A Cu wiring 26 was formed under the conditions given above.

In FIG. 32, "no-Alumina" denotes the data obtained in the case of using the slurry that did not contain the alumina particles 42. On the other hand, "Alumina" denotes the data obtained in the case of using the slurry containing the alumina particles 21. Further, "Silica" denotes the data obtained in the case of using the slurry containing silica particles in place of the alumina particles 42.

As shown in FIG. 32, the polishing rate was markedly lowered in the case of adding the silica particles to the slurry in each of the portion having a low pattern density and the portion having a high pattern density. On the other hand, in the case of adding the alumina particles to the slurry 7, it was possible to increase the polishing rate in each of the portion having a low pattern density and the portion having a high pattern density. Particularly, in the case of adding the alumina particles 42 to the slurry 7, it was possible to increase markedly the polishing rate in the portion having a high pattern density.

SEVENTH EMBODIMENT

Each of the first to sixth embodiments described above is directed to the case where titanium oxide particles were used mainly as the abrasive particles 18. In the seventh embodiment, however, titanium oxide particles doped with nitrogen and/or sulfur are used as the abrasive particles 18.

As described previously, titanium oxide develops the photocatalytic function when irradiated with an ultraviolet light having a wavelength of mainly 380 nm or less. Therefore, it is necessary for the CMP apparatus to be provided with an ultraviolet light irradiating device such as a mercury lamp or a black-light lamp. In addition, the ultraviolet light tends to adversely affect the human body.

However, it is impossible to develop a sufficient photocatalytic function in the case of irradiating the titanium oxide particles 18 with a visible light in place of the ultraviolet light. Therefore, it is impossible to obtain a practical polishing rate in this case. It follows that it is desirable for the abrasive particles 18 to develop a sufficient photocatalytic function even in the case of irradiating the abrasive particles 18 with light having a longer wavelength.

Figures 33A, 33B, 33C:
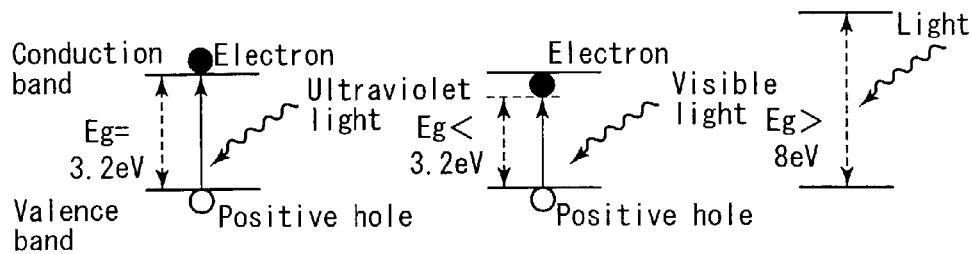
FIG. 33A shows the energy band of titanium oxide.
FIG. 33B shows the energy band of titanium oxide doped with nitrogen.
FIG. 33C shows the energy band of alumina or silica.

FIG. 33A shows the energy band of titanium oxide, FIG. 33B shows the energy band of titanium oxide doped with nitrogen, and FIG. 33C shows the energy band of alumina or silica. As shown in FIG. 33A, titanium oxide has a band gap of 3.2 eV and, thus, is capable of developing the photocatalytic function of absorbing the light in the ultraviolet region. On the other hand, where titanium oxide is doped with nitrogen, a new energy level is formed between the valence band and the conduction band of titanium oxide, as shown in FIG. 33B, so as to make it possible to diminish the effective band gap. It follows that the photocatalytic function can be developed even by irradiation with a visible light having an energy lower than that of the ultraviolet light. Incidentally, the energy band of alumina or silica is larger than 8 eV, as shown in FIG. 33C, with the result that the photocatalytic function cannot be developed even if alumina or silica is irradiated with an ultraviolet light.

Figure 34:
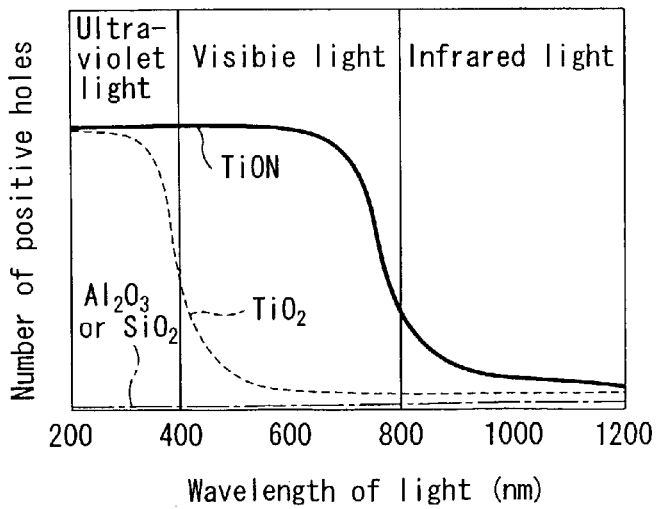
FIG. 34 is a graph showing the relationship between the wavelength of the light irradiating the abrasive particles arid the number of positive holes generated by the excitation with light.

FIG. 34 is a graph showing the relationship between the wavelength of the light irradiating the abrasive particles 18 and the number of positive holes generated by the excitation with light. In the graph of FIG. 34, the wavelength of the light irradiating the abrasive particles 18 is plotted on the abscissa, with the number of positive holes generated in the abrasive particles 18 by the light irradiation being plotted on the ordinate. Incidentally, the oxidizing power of the abrasive particles 18 is substantially proportional to the number of positive holes generated in the abrasive particles 18.

As shown in FIG. 34, where the abrasive particles 18 are formed of titanium oxide, it is certainly possible to generate a sufficiently large number of positive holes in the abrasive particles 18, if the abrasive particles 18 are irradiated with an ultraviolet light. However, it is impossible to generate a sufficiently large number of positive holes in the abrasive particles 18, if the abrasive particles 18 are irradiated with a visible light. On the other hand, in the case of using the abrasive particles 18 made of titanium oxide doped with nitrogen, it is possible to generate a sufficiently large number of positive holes in the abrasive particles 18 even in the case of irradiating the abrasive particles 18 with a visible light as in the case of irradiating the abrasive particles 18 with an ultraviolet light. It follows that, according to the seventh embodiment, it is possible to obtain a sufficient oxidizing power even in the case of irradiating the abrasive particles 18 with a visible light. What should be noted is that, according to the seventh embodiment, it is possible to obtain the effects similar to those described previously in conjunction with each of the first to sixth embodiments even in the case of utilizing a visible light as in the case of utilizing an ultraviolet light as the irradiating light, in the case where the CMP treatment is carried out by the method similar to that employed in each of the first to sixth embodiments, except that the abrasive particles 18 are formed of titanium oxide doped with nitrogen.

In the seventh embodiment, it is possible to use titanium oxide doped with sulfur in place of titanium oxide doped with nitrogen as the material of the abrasive particles 18. Alternatively, it is also possible to use titanium oxide doped with both nitrogen and sulfur in place of titanium oxide doped with nitrogen as the material of the abrasive particles 18. In each of these cases, it is possible to obtain the effects similar to those produced in the case where titanium oxide doped with nitrogen is used as the material of the abrasive particles 18.

In the seventh embodiment, it is desirable for the concentration of nitrogen and/or sulfur in titanium oxide to be not higher than 10 atomic %, more desirably not higher than 2 atomic %. If the concentration of nitrogen and/or sulfur is excessively high, the ability of the abrasive particles 18 as a photocatalyst is lowered. Also, in the seventh embodiment, it is desirable for the concentration of nitrogen and/or sulfur in titanium oxide to be not lower than 0.05 atomic %, more desirably not lower than 0.1 atomic %. If the concentration of nitrogen and/or sulfur is excessively low, it is difficult to develop a sufficiently high photocatalytic function when the abrasive particles 18 are irradiated with a visible light.

In the seventh embodiment, it is desirable for the pH value of the slurry 7 to fall within a range of about 3 to about 5. Where the slurry 7 has a pH value of about 7, the zeta potential of the abrasive particles 18 is rendered close to zero (isoelectric point), with the result that the abrasive particles tend to be agglomerated. Also, where the slurry 7 is alkaline, it is possible for a metal hydroxide that is unlikely to be polished to be formed on the surface of the target metal to be polished, which lowers the polishing rate. Further, where the pH value is smaller than about 3, it is possible for the surface of the target metal to be subjected to a wet etching, which brings about an undesirable dissolution.

In the seventh embodiment, it is possible to prepare the titanium oxide particles 18 doped with nitrogen, titanium oxide particles 18 doped with sulfur and the titanium oxide particles doped with both nitrogen and sulfur by various methods. For example, it is possible to employ a sol-gel method and a chemical reaction method.

EIGHTH EMBODIMENT

It should be noted that the electrons and positive holes generated by irradiating titanium oxide with an ultraviolet light tend to be recombined. In general, the life of each of these electrons and positive holes thus generated is about 100 nsec. The short life of the positive hole tends to limit the oxidizing power of the titanium oxide particles 18 and to limit the polishing rate.

In the eighth embodiment of the present invention, titanium oxide particles supporting a charge separating substance are used as the abrasive particles 18. In the case of using the particular abrasive particles 18, it is possible to suppress the recombination of the electrons and the positive holes generated by irradiating titanium oxide with light. For example, in the case where titanium oxide particles supporting nickel as a charge separating substance are used as the abrasive particles 18, it is possible for the electrons generated by the light irradiation to carry out a reducing reaction represented by the reaction formula "$2H^+ + 2e^- \rightarrow H_2$" on nickel. It follows that the electrons generated by the light irradiation move toward nickel so as to lower the probability of recombination between the positive holes and the electrons.

Figure 35:
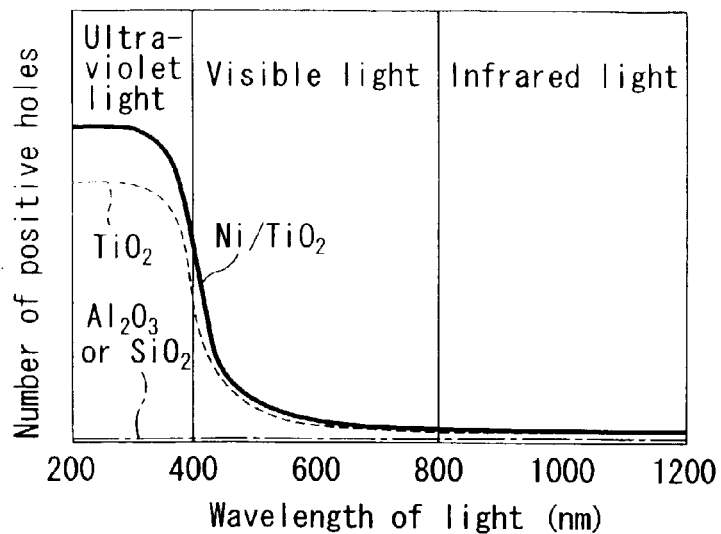
FIG. 35 is a graph showing the relationship between the wavelength of the light irradiating the abrasive particles and the number of positive holes in the abrasive particles.

FIG. 35 is a graph showing the relationship between the wavelength of the light irradiating the abrasive particles 18 and the number of positive holes generated in the abrasive particles 18. In the graph of FIG. 35, the wavelength of the light irradiating the abrasive particles 18 is plotted on the abscissa, with the number of positive holes in the abrasive particles 18 during the light irradiation being plotted on the ordinate.

As shown in FIG. 35, in the case of using the titanium oxide particles 18 supporting a charge separating substance such as nickel, it is possible to increase the number of positive holes in the abrasive particles 18 during the ultraviolet light irradiation, compared with the case of using the titanium oxide particles 18 which do not support a charge separating substance. As a result, the abrasive particles 18 supporting a charge separating substance can exhibit a higher oxidizing power. It follows that, according to the eighth embodiment, it is possible to obtain an effect of increasing the polishing rate as well as the effects described previously in conjunction with each of the first to sixth embodiments in the case where the CMP treatment is carried out by the method equal to that described previously in conjunction with each of the first to sixth embodiments, except that used are the titanium oxide particles supporting a charge separating substance.

In the eighth embodiment, any of nickel, copper, silver, gold, niobium and a mixture thereof is used as the charge separating substance. It should be noted that lead, vanadium and chromium are highly toxic and, thus, it is dangerous to use these metals as the charge separating substance. In addition, these metals cause an environmental problem. Particularly, vanadium oxide is especially poisonous and, thus, it is dangerous to use. On the other hand, nickel, copper, silver, gold and niobium are less poisonous and, thus, can be handled easily.

In the eighth embodiment, it is desirable for the coverage, i.e., the area of the surface of titanium oxide that is covered with the charge separating substance, to be not higher than 90%, more desirably not higher than 60%. If the coverage is excessively high, it is possible for the ability of the abrasive particles 18 as the photocatalyst to be lowered. Also, in the eighth embodiment, it is desirable for the coverage noted above to be not lower than 5%, more desirably not lower than 10%. If the coverage is excessively low, it is impossible to lower prominently the probability of the recombination between the positive holes and the electrons.

NINTH EMBODIMENT

In the ninth embodiment of the present invention, the technologies described in conjunction with the seventh and eighth embodiments are utilized in combination. To be more specific, titanium oxide particles supporting a charge separating substance and doped with nitrogen and/or sulfur are used as the abrasive particles.

Figure 36:
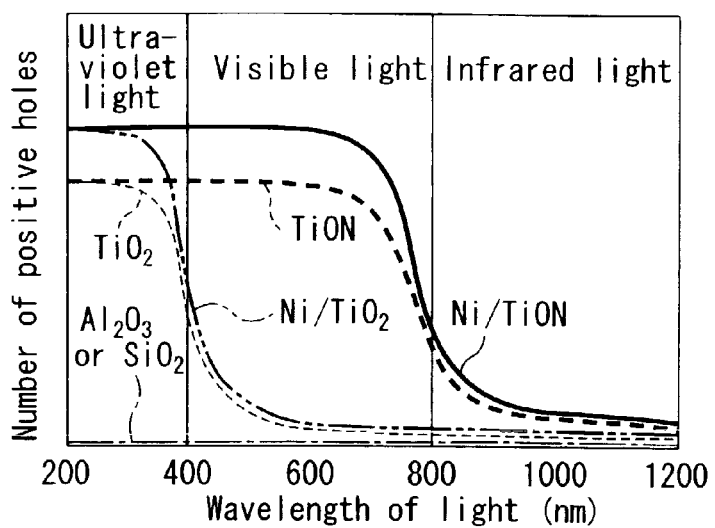
FIG. 36 is a graph showing the relationship between the wavelength of the light irradiating the abrasive particles and the number of positive holes in the abrasive particles.

FIG. 36 is a graph showing the relationship between the wavelength of the light irradiating the abrasive particles 18 and the number of positive holes in the abrasive particles 18. In the graph of FIG. 36, the wavelength of the light irradiating the abrasive particles 18 is plotted on the abscissa, with the number of positive holes in the abrasive particles 18 during the light irradiation being plotted on the ordinate.

As shown in FIG. 36, in the case of using titanium oxide particles 18 supporting a charge separating substance such as nickel and doped with nitrogen, it is possible to increase the number of positive holes in the abrasive particles 18 during the irradiation with not only an ultraviolet light but also a visible light, compared with use of the titanium oxide particles not supporting a charge separating substance and not doped with nitrogen. It follows that it is possible to obtain a higher oxidizing power even by the irradiation with a visible light and to realize a higher polishing rate. In other words, it is possible to obtain simultaneously the effects described previously in conjunction with the seventh and eighth embodiments. Incidentally, it is possible to use, for example, any of nickel, copper, silver, gold, platinum, niobium and a mixture thereof as the charge separating substance.

Figure 37:
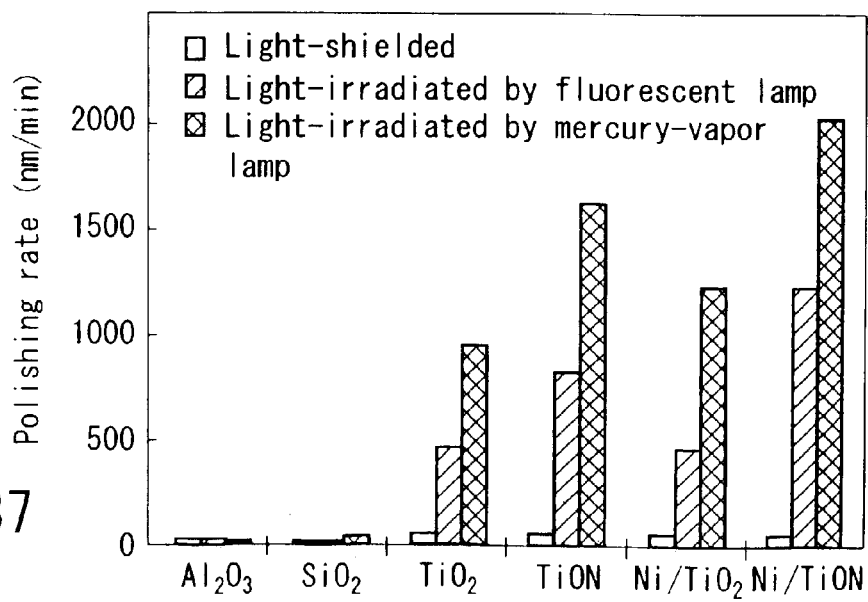
FIG. 37 is a graph showing the relationship between the kind of the abrasive particles and the polishing rate.

FIG. 37 is a graph showing the relationship between the kind of the abrasive particles and the polishing rate. The data given in FIG. 37 was obtained in the case of forming the structure shown in FIG. 16A under the conditions given below. Specifically, a slurry containing about 3% by weight of the abrasive particles 18 and having a pH value of about 3 was used as the slurry 7 for the CMP treatment. Also, IC1000/Suba400 was used as the polishing cloth (polishing pad). In performing the CMP treatment, a mercury lamp of 500 W was kept lit. The load was about 300 gf/cm². The rotating speed, i.e., the number of revolutions per second, of the head 3 was about 100 rpm. The rotating speed of the turntable was about 100 rpm. Further, the flow rate of the slurry was set at 200 cc/min. Copper wirings 26 each having a width of 43.50 μm were formed 7.5 μm apart from each other under the conditions given above.

In FIG. 37, "$Al_2O_3$", "$SiO_2$" and "$TiO_2$" denote the data obtained in the cases where the abrasive particles 18 were made of aluminum oxide particles, silicon oxide particles and titanium oxide particles, respectively. Also, "TiON" covers the date obtained in the case where the abrasive particles 18 were made of titanium oxide particles doped with nitrogen. Further, "Ni/$TiO_2$" denotes the data obtained in the case where the abrasive particles 18 were made of titanium oxide particles supporting Ni. Still further, "Ni/TiON" denotes the data obtained in the case where the abrasive particles 18 were made of titanium oxide particles doped with nitrogen and supporting Ni.

As shown in FIG. 37, in the case of using the titanium oxide particles as the abrasive particles 18, it is possible to obtain a practical polishing rate if the CMP treatment is carried out while irradiating the slurry 7 with light emitted from the mercury lamp of 500 W. However, it was impossible to obtain a practical polishing rate when the CMP treatment was carried out while irradiating the slurry 7 with the light emitted from a fluorescent lamp of 30 W. On the other hand, in the case of using the titanium oxide particles doped with nitrogen as the material of the abrasive particles 18, it was possible to obtain a high polishing rate when the CMP treatment was carried out while irradiating the slurry 7 with the light emitted from the mercury lamp, and it was possible to obtain a practical polishing rated when the CMP treatment was carried out while irradiating the slurry 7 with the light emitted from the fluorescent lamp. Also, in the case of using the titanium oxide particles supporting Ni as the abrasive particles 18, it was possible to obtain a higher polishing rate when the CMP treatment was carried out while irradiating the slurry 7 with the light emitted from the mercury lamp. Further, in the case of using the titanium oxide particles doped with nitrogen and supporting Ni as the abrasive particles 18, it was possible to obtain a very high polishing rate when the CMP treatment was carried out while irradiating the slurry 7 with the light emitted from the mercury lamp, and it was also possible to obtain a very high polishing rate when the CMP treatment was carried out while irradiating the slurry 7 with the light emitted from the fluorescent lamp.

Incidentally, a wet etching was performed by dipping a Cu film in the slurry 7 having the titanium oxide particles dispersed therein as the abrasive particles 18. It has been found that the etching rate was not higher than 1 nm/min in each of the light irradiated condition and the light shielded condition. Also, in the case of using the titanium oxide particles as the abrasive particles 18, the polishing rate during the light shielded condition was markedly lower than that during the light irradiated condition, as shown in FIG. 37. It has been confirmed by the experimental data referred to above that, in the CMP treatment using the titanium oxide particles as the abrasive particles 18, the wet etching performed by the pH adjuster dissolved in the dispersion medium 25 scarcely contributes to the removal of copper, and that the copper removal is performed mainly by the oxidation of copper performed by the titanium oxide particles 18 and by the resultant mechanical polishing of copper performed by the titanium oxide particles 18.

Further, in each of the cases where the titanium oxide particles were used as the abrasive particles 18, where the titanium oxide particles doped with nitrogen were used as the abrasive particles 18, where the titanium oxide particles supporting Ni were used as the abrasive particles 18, and where the titanium oxide particles doped with nitrogen and supporting Ni were used as the abrasive particles 18, the dishing or erosion was not larger than 60 nm at the over-polished stage at which 60% of additional polishing was performed from the just polished stage. In other words, it was possible to obtain a satisfactory flatness.

TENTH EMBODIMENT

A tenth embodiment of the present invention will now be described. In each of the first to ninth embodiments, the photocatalytic function of the abrasive particles 18 was utilized during the CMP treatment. In the tenth embodiment, however, the photocatalytic function of the abrasive particles 18 is utilized during storage of the slurry 7 for the CMP treatment. To be more specific, according to the tenth embodiment, there is provided a method of handling a chemical mechanical polishing slurry, comprising continuously or intermittently irradiating a chemical mechanical polishing slurry with light during storage of the slurry, the slurry comprising a dispersion medium and abrasive particles dispersed in the dispersion medium and exhibiting an photocatalytic function upon irradiation with light.

As described previously, if the slurry 7 for the CMP treatment is stored without being used, the abrasive particles are agglomerated so as to form gigantic coarse particles, which are finally precipitated. Used in the tenth embodiment are abrasive particles 18 whose degree of dispersion is improved upon irradiation with light, e.g., titanium oxide particles, and the slurry 7 is continuously irradiated with light during storage of the slurry 7. As a result, a good dispersed state of the abrasive particles can be maintained. Incidentally, if it is possible to maintain a good dispersed state of the abrasive particles 18, e.g., the dispersed state that the abrasive particles 18 are not precipitated, it is possible to irradiate the slurry 7 with light intermittently in place of the continuous irradiation. Also, the intensity of the light irradiating the slurry 7 is not particularly limited, as far as it is possible to maintain a good dispersed state of the abrasive particles 18.

Figure 38:
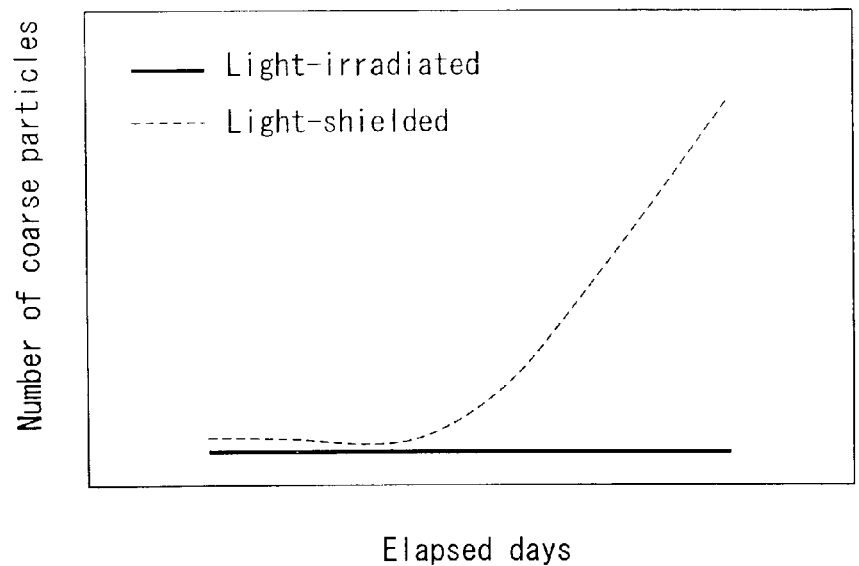
FIG. 38 is a graph showing the relationship between the days of storage of the CMP slurry and the number of coarse particles in the slurry.

FIG. 38 is a graph showing the relationship between the days of storage of the slurry for the CMP treatment and the number of coarse particles contained in the slurry. In the graph of FIG. 38, the days of storage (elapsed days) are plotted on the abscissa, with the number of coarse particles are plotted on the ordinate. Also, the solid line in FIG. 38 denotes the data obtained in the case where the titanium oxide particles were used as the abrasive particles and the slurry 7 was kept irradiated with an ultraviolet light during the storage of the slurry 7. On the other hand, the broken line in FIG. 38 denotes the data obtained in the case where the slurry 7 was not irradiated with the light during storage of the slurry 7.

As shown in FIG. 38, the number of coarse particles was increased with time in the case where the slurry 7 was not irradiated with the light. On the other hand, the number of coarse particles remained substantially constant regardless of the storage time in the case where the slurry 7 was continuously irradiated with the ultraviolet light.

It should be noted that, if the slurry 7 for the CMP treatment containing the abrasive particles 18, in which an oxidizing power or a reducing power is induced upon irradiation with light such as titanium oxide particles, is stored without being used, the oxidizing power or the reducing power induced upon irradiation with light tends to be lowered. It is effective to irradiate the slurry 7 with light continuously or intermittently during storage of the slurry 7 in this respect, too.

Figure 39:
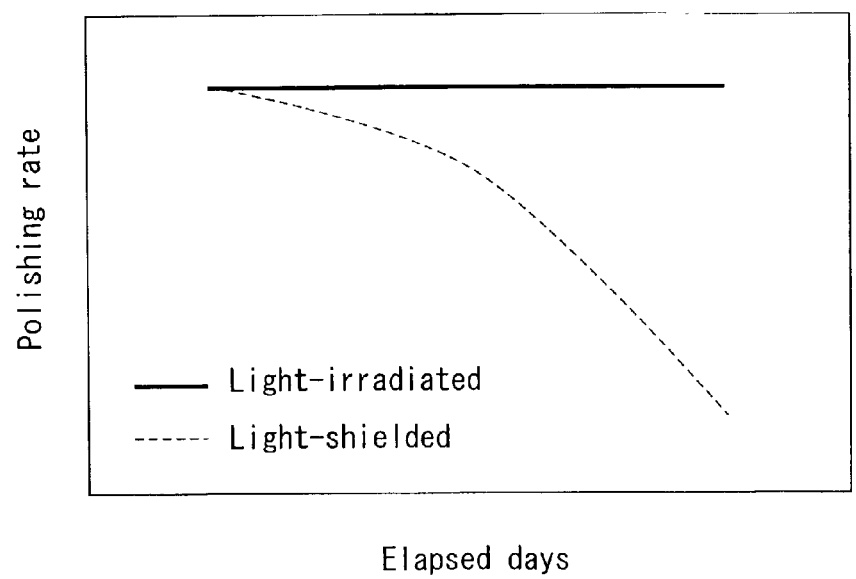
FIG. 39 is a graph showing the relationship between the days of storage of the CMP slurry and the polishing rate.

FIG. 39 is a graph showing the relationship between the days of storage of the slurry for the CMP treatment and the polishing rate. In the graph of FIG. 39, the days of storage (elapsed days) is plotted on the abscissa, with the polishing rate is plotted on the ordinate. Also, the solid line in FIG. 39 denotes the data obtained in the case where titanium oxide particles were used as the abrasive particles 18 and the slurry 7 was continuously irradiated with an ultraviolet light during storage of the slurry 7, and the broken line denotes the data obtained in the case where the slurry 7 was not irradiated with light during storage of the slurry 7.

As shown in FIG. 39, the polishing rate was decreased with time in the case where the slurry 7 was not irradiated with the light during storage of the slurry 7. On the other hand, the polishing rate was maintained substantially constant regardless of the storage time in the case where the slurry 7 was continuously irradiated with light during storage of the slurry 7.

As described above, the tenth embodiment makes it possible to suppress the deterioration of the slurry 7 derived from, for example, the agglomeration of the abrasive particles 18. Also, even if the slurry 7 is stored for a long time under the state that the slurry 7 is kept irradiated with an ultraviolet light, a photochemical reaction is unlikely to take place, except that a high degree of dispersion and a high oxidizing power of the abrasive particles are maintained. In addition, even if the other photochemical reactions take place, the effect of these photochemical reactions on the slurry 7 is very small. It follows that the tenth embodiment makes it possible increase markedly the life of the slurry for the CMP reaction.

ELEVENTH EMBODIMENT

An eleventh embodiment of the present invention will now be described. In the eleventh embodiment, the photocatalytic function of the abrasive particles 18 is utilized after the slurry 7 is used for the CMP treatment. To be more specific, according to the eleventh embodiment, there is provided a method of handling a chemical mechanical polishing slurry, comprising releasing to a natural environment a chemical mechanical polishing slurry comprising a dispersion medium and abrasive particles dispersed in the dispersion medium and exhibiting a photocatalytic function upon irradiation with light, an oxidizing power of the abrasive particles being improved upon irradiation with light, and irradiating the slurry released to the natural environment with light so as to clean at least one of the natural environment and the slurry.

It is possible for the waste liquid of the slurry 7 for the CMP treatment to contain a large amount of, for example, organic materials that cannot be decomposed under the natural environment. In the eleventh embodiment, the waste slurry 7 after use is irradiated with light capable of inducing an oxidizing power or a reducing power in the abrasive particles 18 so as to decompose the organic materials or the like contained in the waste slurry 7. If such a decomposing treatment is applied, the environment is not affected even if the waste slurry after use is discarded to the natural environment. In other words, it is rendered unnecessary to carry out a chemical processing (or purification) using, for example, a chemical solution.

It should be noted that sunlight contains light components having various wavelengths and, thus, is capable of inducing an oxidizing power or a reducing power in the abrasive particles 18. Therefore, it is possible to utilize sunlight which contains ultraviolet light for decomposing the organic materials or the like contained in the slurry 7. For example, even if the waste slurry 7 after use, to which the decomposing treatment noted above is not applied, is discarded into the natural environment to which sunlight is present, the organic materials or the like contained in the discarded waste slurry 7 can be decomposed by irradiation with sunlight. Also, where the waste slurry 7 is discharged into the natural environment where sunlight is present, it is possible to clean the natural environment. For example, tetrachloroethylene, which is a typical contaminant of the environment, can be decomposed under the photocatalytic function exhibited by titanium oxide, as denoted by the reaction formula given below:

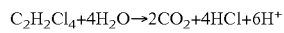

$$C_2H_2Cl_4 + 4H_2O \rightarrow 2CO_2 + 4HCl + 6H^+$$

As described above, the eleventh embodiment makes it possible to render the waste slurry 7 after use substantially harmless and permits the waste slurry 7 after use to be utilized for cleaning the natural environment.

TWELFTH EMBODIMENT

In the eleventh embodiment, the waste slurry 7 after use is utilized for the cleaning of the natural environment. In the twelfth embodiment of the present invention, however, the waste slurry 7 after use is utilized again for the CMP treatment.

Figure 40:
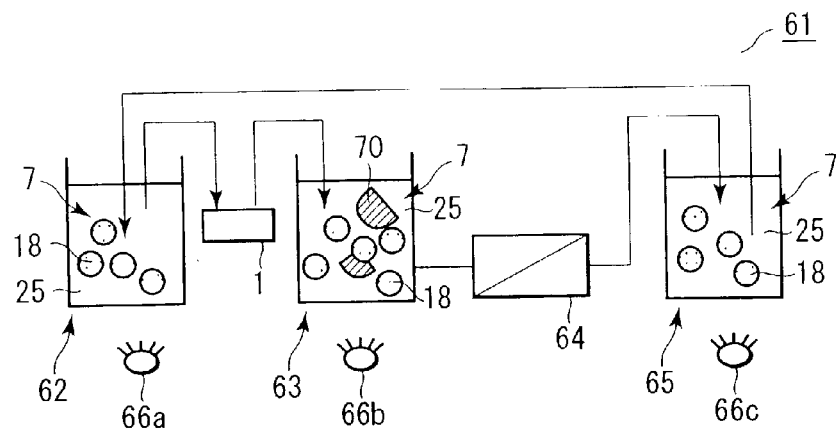
FIG. 40 schematically shows the reuse system of the CMP slurry according to a twelfth embodiment of the present invention.

FIG. 40 schematically shows a reuse system 61 of the slurry for the CMP treatment according to the twelfth embodiment of the present invention. The reuse system 61 shown in FIG. 40 comprises a slurry supply device 62 for supplying the slurry 7 into the CMP apparatus 1, a slurry recovery device 63 for recovering the slurry 7 used in the CMP apparatus 1, a filter 64 for removing the polishing refuse 70 from the used slurry 7 recovered by the slurry recovery device 63 so as to regenerate the slurry 7, a regenerated slurry supply device 65 for supplying the regenerated slurry 7 having the polishing refuse 70 removed therefrom by the filter 64 into the slurry supply device 62, and light irradiating devices 66a to 66c. Incidentally, it is possible for the CMP device 1 used in this system to include the light irradiation devices 10 and/or 33 like the CMP device 1 described previously with reference to FIGS. 8 and 12.

The cost of the polishing pad and the cost of the slurry constitute a major portion of the running cost of the CMP apparatus. Therefore, the technology for reusing the used slurry is important in view of the cost. However, it was difficult to reuse the slurry in the past partly because ammonium persulfate, iron nitrate, an organic acid, etc. used as an oxidizing agent in the conventional slurry perform reactions with a metal so as to form compounds, and partly because the polishing refuse generated by the CMP treatment and the abrasive particles form coarse particles, which decrease the amount of the abrasive particles that can be reused.

In the twelfth embodiment, the abrasive particles 18 whose degree of dispersion and oxidizing power can be increased by the irradiation with light such as the titanium oxide particles are utilized as the oxidizing agent, and an oxidizing agent is not added separately. Therefore, it is possible to suppress formation of the undesired metal compound. Also, since the ability of the titanium oxide particles 18 as an oxidizing agent is one of the abilities of the photocatalyst, it is possible to use repeatedly the titanium oxide particles. In addition, even if the polishing refuse 70 and the abrasive particles 18 are combined to form coarse particles, it is possible to separate the polishing refuse 70 and abrasive particles 18 by the irradiation with light so as to make it possible to separate easily the abrasive particles 18 from the polishing refuse. It follows that the twelfth embodiment makes it possible to easily recover a large amount of the abrasive particles 18.

THIRTEENTH EMBODIMENT

Figure 41:
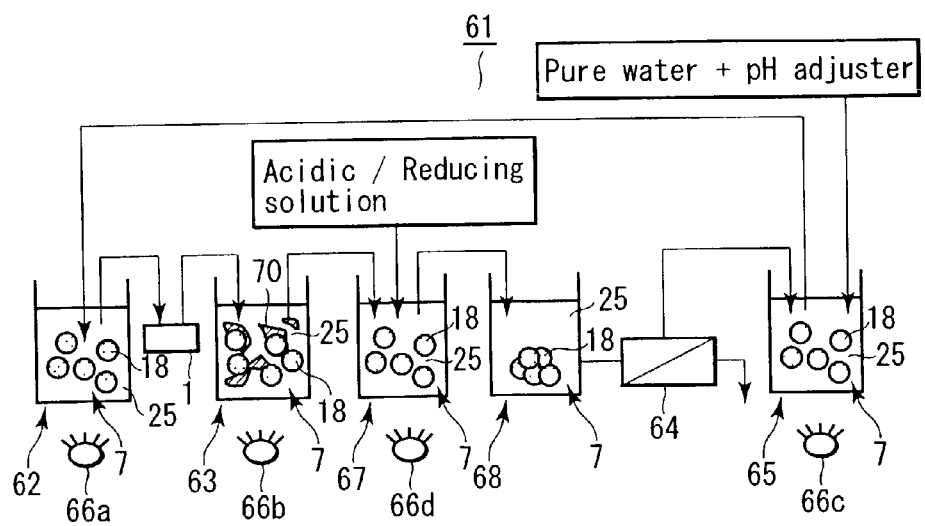
FIG. 41 schematically shows the reuse system of the CMP slurry according to a thirteenth embodiment of the present invention.

FIG. 41 schematically shows a reuse system 61 of the slurry 7 for the CMP treatment according to the thirteenth embodiment of the present invention. The reuse system 61 shown in FIG. 41 comprises a slurry supply device 62 for supplying the slurry 7 into the CMP apparatus 1, a slurry recovery device 63 for recovering the slurry 7 used in the CMP apparatus 1, a dissolving device 67 for dissolving the polishing refuse contained in the used slurry 7 recovered by the slurry recovery device 63, an agglomerating device 68 for shielding the light applied to the abrasive particles 18 contained in the slurry 7 which is processed in the dissolving device 67 so as to agglomerate the abrasive particles, a filter 64 for separating the agglomerated abrasive particles 18 contained in the slurry 7 processed in the agglomerating device 68, a regenerated slurry supply device 65 for mixing the abrasive particles 18 recovered by the filter 64 with a new dispersion medium 25, etc. so as to regenerate the slurry 7 and for supplying the regenerated slurry 7 into the slurry supply device 62, and light irradiating devices 66a to 66c. Incidentally, it is possible for the CMP apparatus 1 included in the reuse system 61 described above to include the light irradiating devices 10 and/or 33 like the CMP apparatus 1 described previously with reference to FIGS. 8 and 12.

The thirteenth embodiment differs from the twelfth embodiment in that the polishing refuse contained in the used slurry 7 is removed by the dissolving treatment in the thirteenth embodiment in place of removing the polishing refuse by the filtering as in the twelfth embodiment. Therefore, the thirteenth embodiment produces the effects of preventing the polishing refuse 70 from entering the regenerated slurry 7 and preventing the abrasive particles 18 from being filtered on filtering the polishing refuse 70 so as to suppress the lowering of the recovery rate of the abrasive particles 18, in addition to the effects described previously in conjunction with the twelfth embodiment. It should also be noted that, in the thirteenth embodiment, the components of the used slurry other than the abrasive particles 18 are not reused, with the result that the regenerated slurry 7 produces the polishing function equivalent to that produced by the new slurry 7. Further, in the thirteenth embodiment, the abrasive particles 18 are agglomerated to form secondary particles, e.g., those having a secondary particle diameter of about 100 μm, in order to separating the agglomerated secondary particles from the dispersion medium 25. It follows that the abrasive particles 18 can be recovered highly efficiently.

In the thirteenth embodiment, the dissolving treatment of the polishing refuse 70 performed in the dissolving device 67 can be performed by mixing, for example, the slurry 7 supplied from the slurry recovery device 63 with about 6 mols/L of an aqueous solution of nitric acid. In this case, the polishing refuse 70, e.g., copper oxide, is dissolved as denoted by the reaction formula given below:

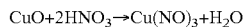

$CuO + 2HNO_3 \rightarrow Cu(NO_3)_2 + H_2O$

Also, the polishing refuse 70 can be dissolved in the dissolving device 67 by mixing, for example, the slurry 7 supplied from the slurry recovery device 63 with about 6 mols/L of an aqueous solution of hydrochloric acid. In this case, the polishing refuse, e.g., copper oxide, can be dissolved as denoted by the reaction formula given below:

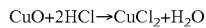

$CuO + 2HCl \rightarrow CuCl_2 + H_2O$

In the twelfth and thirteen embodiments, it is possible for the slurry 7 to contain organic components other than organic acids. For example, it is possible for the slurry 7 to contain a surfactant. It should be noted in this connection that, even if the slurry 7 does not contain a surfactant in each of the twelfth and thirteenth embodiments, it is possible to maintain a good dispersed state of the abrasive particles 18 by continuously or intermittently turning on the light irradiating devices 66a to 66c and the light irradiating devices 10 and/or 33. In addition, where the slurry 7 does not contain an organic material, the organic component is not denatured and, thus, it is unnecessary to newly add an organic component to the regenerated slurry. It follows that it is desirable for the slurry 7 not to contain an organic component in view of saving the running cost. Incidentally, where an organic component such as an organic acid is not added to the slurry 7, it is possible to control the pH value of the slurry 7 by using an inorganic acid as the pH adjuster. It follows that it is possible for the slurry 7 to contain only the dispersion medium 25 such as water, the abrasive particles 18 such as titanium oxide particles and an inorganic acid.

In each of the twelfth and thirteen embodiments, it is possible to use the slurry 7 described previously in conjunction with the first to ninth embodiments. It should be noted, however, that, since the slurry 7 described in conjunction with the fourth and fifth embodiments contains an organic component, it is desirable to use the slurry 7 described in conjunction with the first to third and sixth to ninth embodiments.

It is possible to combine the techniques relating to each of the embodiments described above. For example, it is possible to use the abrasive particles 18 described in conjunction with any of the seventh to ninth embodiments in the slurry 7 described in conjunction with the fifth or sixth embodiment. Also, it is possible to add at least one of the resin particles described in conjunction with the fifth embodiment and the inorganic particles described in conjunction with the sixth embodiment to the slurry described in conjunction with the fourth embodiment. Further, it is possible to use in combination at least two kinds of the abrasive particles 18 selected from the group consisting of the abrasive particles 18 described in conjunction with the first to third embodiments, the abrasive particles 18 described in conjunction with the seventh embodiment, and the abrasive particles described in conjunction with the eighth embodiment.

As described above, a slurry containing abrasive particles exhibiting the photocatalytic function upon irradiation with light is used in the present invention as the slurry for the CMP treatment. The particular abrasive particles are capable of changing the oxidizing power or the reducing power and/or the hydrophilic properties upon irradiation with light. As a result, it is possible to carry out a high precision polishing at a high polishing rate. Also, the slurry for the CMP treatment used in the present invention can be stored or discarded easily.

As described above, the present invention provides a slurry for the CMP treatment that permits a high precision polishing with a high polishing rate, a method of manufacturing a semiconductor device using the particular slurry, and an apparatus for manufacturing a semiconductor device capable of using the particular slurry.

Additional advantages and modifications will readily occur to those skilled in the art. Therefore, the present invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A method of manufacturing a semiconductor device, comprising irradiating a chemical mechanical polishing slurry with light while polishing a section of a target substrate to be polished, the slurry comprising at least one mixture selected from the group consisting of:

a mixture that comprises a dispersion medium, abrasive particles dispersed in the dispersion medium and exhibiting a photocatalytic function upon irradiation with light, and resin particles dispersed in the dispersion medium; and a mixture that comprises a dispersion medium and abrasive particles dispersed in the dispersion medium and exhibiting a photocatalytic function upon irradiation with light, the abrasive particles containing titanium, oxygen, and at least one element selected from the group consisting of nitrogen and sulfur.

2. A method according to claim 1, wherein the light is emitted from a side of the target substrate that is opposite to the polishing section.

3. A method according to claim 1, wherein the chemical mechanical polishing treatment is carried out while rotating a polishing member used in the chemical mechanical polishing treatment at a rotating speed falling within a range of 60 rpm to 140 rpm.

4. A method according to claim 1, wherein a polishing member used in the chemical mechanical polishing treatment has a conductive component concentration equal to or less than 3% by weight.

5. A method according to claim 1 further comprising irradiating the slurry that has been used for the chemical mechanical polishing treatment with light after the chemical mechanical polishing treatment.

6. A method according to claim 1, wherein at least one of an intensity and a spectrum of the light is changed during the chemical mechanical polishing treatment.

7. A method according to claim 6, wherein at least one of an intensity and a spectrum of the light is changed on the basis of at least one of a load applied to a substrate holding tool holding the target substrate to be polished and a load applied to a polishing tool holding a polishing member.

8. A method according to claim 1, wherein the polishing section includes a layer containing a metal as a main component.

9. A method according to claim 8, wherein the layer containing a metal as a main component contains a metal-containing material selected from the group consisting of a metal, an alloy, a metal nitride, a metal boride, a metal oxide, and a metal compound containing at least two of nitrogen, boron and oxygen, and wherein the metal-containing material contains a metal selected from the group consisting of aluminum, copper, tungsten, titanium, molybdenum, niobium, tantalum and vanadium.

10. A method of manufacturing a semiconductor device comprising applying a chemical mechanical polishing treatment to a polishing section of a target substrate to be polished by relatively moving a polishing member and the target substrate, the chemical mechanical polishing treatment comprising:
  supplying a chemical mechanical polishing slurry comprising a dispersion medium and abrasive particles dispersed in the dispersion medium and exhibiting a photocatalytic function upon irradiation with light into a region between the polishing member and the target substrate; and
  irradiating the target substrate with light such that the slurry interposed between the polishing member and the target substrate is irradiated with light which is transmitted through the target substrate.

11. A method according to claim 10, wherein the chemical mechanical polishing treatment is carried out while rotating the polishing member at a rotating speed falling within a range of 60 rpm to 140 rpm.

12. A method according to claim 10, wherein the polishing member has a conductive component concentration equal to or less than 3% by weight.

13. A method according to claim 10, further comprising irradiating the slurry that has been used for the chemical mechanical polishing treatment with light after the chemical mechanical polishing treatment.

14. A method according to claim 10, wherein at least one of an intensity and a spectrum of the light is changed during the chemical mechanical polishing treatment.

15. A method according to claim 14, wherein at least one of the intensity and the spectrum of the light is changed on the basis of at least one of a load applied to a substrate holding tool holding the target substrate to be polished and a load applied to a polishing tool holding the polishing member.

16. A method according to claim 10, wherein the polishing section includes a layer containing a metal as a main component.

17. A method according to claim 16, wherein the layer containing a metal as a main component contains a metal-containing material selected from the group consisting of a metal, an alloy, a metal nitride, a metal boride, a metal oxide, and a metal compound containing at least two of nitrogen, boron and oxygen, and wherein the metal-containing material contains a metal selected from the group consisting of aluminum, copper, tungsten, titanium, molybdenum, niobium, tantalum and vanadium.

18. A method of manufacturing a semiconductor device, comprising:
  forming an insulating film provided with a recessed portion above a semiconductor substrate;
  forming a barrier layer containing tungsten nitride on the insulating film so as to cover a bottom surface and a side wall of the recessed portion;
  forming a metal layer containing copper on the barrier layer so as to fill the recessed portion with the metal layer; and
  applying a chemical mechanical polishing treatment to the metal layer, the chemical mechanical polishing treatment comprising:
  supplying a chemical mechanical polishing slurry;
  irradiating the slurry supplied onto the polishing member with light; and
  relatively moving the polishing member and the semiconductor substrate with the slurry irradiated with light interposed between the polishing member and the metal layer, wherein the slurry comprises at least one mixture selected from the group consisting of:
    a mixture that comprises a dispersion medium, abrasive particles dispersed in the dispersion medium and exhibiting a photocatalytic function upon irradiation with light, and resin particles dispersed in the dispersion medium; and
    a mixture that comprises a dispersion medium and abrasive particles dispersed in the dispersion medium and exhibiting a photocatalytic function upon irradiation with light, the abrasive particles containing titanium, oxygen, and at least one element selected from the group consisting of nitrogen and sulfur.

19. A method according to claim 18, wherein the chemical mechanical polishing treatment is carried out while rotating the polishing member at a rotating speed falling within a range of 60 rpm to 140 rpm.

20. A method according to claim 18, wherein the polishing member has a conductive component concentration equal to or less than 3% by weight.

21. A method according to claim 18, further comprising irradiating the slurry that has been used for the chemical mechanical polishing treatment with light after the chemical mechanical polishing treatment.

22. A method of manufacturing a semiconductor device, comprising:
- applying a chemical mechanical polishing treatment to a polishing section of a target substrate to be polished by using a chemical mechanical polishing slurry comprising a dispersion medium and abrasive particles dispersed in the dispersion medium and exhibiting a photocatalytic function upon irradiation with light;
- dissolving a polishing refuse into the dispersion medium of a waste slurry while irradiating the waste slurry with light, the polishing refuse being generated by the chemical mechanical polishing treatment and contained in the waste slurry, and the waste slurry being the chemical mechanical polishing slurry that has been used for the chemical mechanical polishing treatment;
- agglomerating the abrasive particles in the waste slurry by shielding the waste slurry from light;
- recovering the agglomerated abrasive particles from the waste slurry; and
- forming a regenerated slurry that is to be utilized for the chemical mechanical polishing treatment by using the recovered abrasive particles.

* * * * *